United States Patent
Puchner et al.

(10) Patent No.: US 9,553,175 B2
(45) Date of Patent: Jan. 24, 2017

(54) SONOS TYPE STACKS FOR NONVOLATILE CHARGE TRAP MEMORY DEVICES AND METHODS TO FORM THE SAME

(71) Applicant: Cypress Semiconductor Corporation, San Jose, CA (US)

(72) Inventors: Helmut Puchner, Santa Clara, CA (US); Igor Polishchuk, Fremont, CA (US); Sagy Charel Levy, Zichron Yaakov (IL)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 14/824,023

(22) Filed: Aug. 11, 2015

(65) Prior Publication Data

US 2016/0104789 A1    Apr. 14, 2016

Related U.S. Application Data

(63) Continuation of application No. 14/105,041, filed on Dec. 12, 2013, now Pat. No. 9,105,740, which is a continuation of application No. 13/952,294, filed on Jul. 26, 2013, now abandoned, which is a continuation of application No. 13/454,985, filed on Apr. 24, 2012, now abandoned, which is a continuation of application No. 12/413,389, filed on Mar. 27, 2009, now Pat. No. 8,163,660.

(60) Provisional application No. 61/053,617, filed on May 15, 2008, provisional application No. 61/053,620, filed on May 15, 2008.

(51) Int. Cl.
*H01L 21/3205* (2006.01)
*H01L 29/66* (2006.01)
*H01L 21/28* (2006.01)
*H01L 29/423* (2006.01)
*H01L 29/51* (2006.01)
*H01L 29/792* (2006.01)

(52) U.S. Cl.
CPC ... *H01L 29/66833* (2013.01); *H01L 21/28282* (2013.01); *H01L 29/4234* (2013.01); *H01L 29/513* (2013.01); *H01L 29/792* (2013.01)

(58) Field of Classification Search
CPC .................. H01L 29/66833; H01L 21/28282
See application file for complete search history.

(56) References Cited

U.S. PATENT DOCUMENTS

| | | | |
|---|---|---|---|
| 7,799,670 B2 * | 9/2010 | Ramkumar | ....... H01L 21/28282 257/325 |
| 8,163,660 B2 | 4/2012 | Puchner et al. | |
| 2001/0012667 A1 | 8/2001 | Ma et al. | |
| 2003/0178675 A1 * | 9/2003 | Nishizaka | ............. H01L 27/105 257/340 |

(Continued)

OTHER PUBLICATIONS

USPTO Advisory Action for U.S. Appl. No. 12/413,389 dated Aug. 24, 2011; 4 pages.

(Continued)

*Primary Examiner* — Bradley K Smith
(74) *Attorney, Agent, or Firm* — Lowenstein Sandler LLP

(57) ABSTRACT

A method includes forming a first oxide layer. The method further includes etching a portion of the first oxide layer using a first decoupled plasma nitridation process. The method includes forming, subsequent to the etching, a charge-trapping layer on the first oxide layer.

20 Claims, 21 Drawing Sheets

(56) References Cited

U.S. PATENT DOCUMENTS

| | | | |
|---|---|---|---|
| 2003/0232507 A1* | 12/2003 | Chen .................. | H01L 21/28158 438/763 |
| 2004/0082198 A1* | 4/2004 | Nakamura ........ | H01J 37/32192 438/787 |
| 2007/0298568 A1* | 12/2007 | Mokhlesi .......... | H01L 21/28273 438/257 |
| 2010/0090294 A1* | 4/2010 | Narwankar ....... | H01L 21/28185 257/411 |
| 2010/0167506 A1 | 7/2010 | Lin et al. | |

OTHER PUBLICATIONS

USPTO Advisory Action for U.S. Appl. No. 13/454,985 dated Mar. 20, 2014; 4 pages.

USPTO Final Rejection for U.S. Appl. No. 12/413,389 dated Jun. 3, 2011; 19 pages.

USPTO Final Rejection for U.S. Appl. No. 12/413,389 dated Oct. 26, 2011; 20 pages.

USPTO Final Rejection for U.S. Appl. No. 13/454,985 dated Jan. 3, 2014; 9 pages.

USPTO Final Rejection for U.S. Appl. No. 13/454,985 dated Nov. 4, 2013; 6 pages.

USPTO Non-Final Rejection for U.S. Appl. No. 12/413,389 dated Dec. 23, 2010; 18 pages.

USPTO Non-Final Rejection for U.S. Appl. No. 13/454,985 dated Mar. 1, 2013; 5 pages.

USPTO Non-Final Rejection for U.S. Appl. No. 14/105,041 dated Oct. 10, 2014; 11 pages.

USPTO Notice of Allowance for U.S. Appl. No. 12/413,389 dated Feb. 27, 2012; 5 pages.

USPTO Notice of Allowance for U.S. Appl. No. 14/105,041 dated Apr. 1, 2015; 6 pages.

USPTO Advisory Action for U.S. Appl. No. 12/413,389 dated Aug. 24, 2011; 1 page.

* cited by examiner

SONOS TYPE STACKS FOR NONVOLATILE CHARGE TRAP MEMORY DEVICES AND METHODS TO FORM THE SAME

PRIORITY

This application is a continuation of U.S. patent application Ser. No. 14/105,041, filed on Dec. 12, 2013, now U.S. Pat. No. 9,105,740, issued on Aug. 11, 2015, which is a continuation of U.S. patent application Ser. No. 13/952,294, filed Jul. 26, 2013, now Abandoned, which is a continuation of U.S. application Ser. No. 13/454,985, filed Apr. 24, 2012, now Abandoned, which is a continuation of U.S. application Ser. No. 12/413,389, filed Mar. 27, 2009 now U.S. Pat. No. 8,163,660 issued on Apr. 24, 2012, which claims priority to U.S. Provisional Patent Application No. 61/053,620 filed May 15, 2008, and U.S. Provisional Patent Application No. 61/053,617 filed May 15, 2008, all of which are incorporated by reference herein in their entirety.

TECHNICAL FIELD

Embodiments of the present invention are in the field of semiconductor devices and, in particular. SONOS-type stacks for nonvolatile charge trap memory devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. Optimizing the performance of each device becomes increasingly significant.

Non-volatile semiconductor memories may use stacked floating gate type field-effect-transistors. In such transistors, electrons may be injected into a floating gate of a memory cell to be programmed by biasing a control gate and grounding a body region of a substrate on which the memory cell is formed. An oxide-nitride-oxide (ONO) stack may be used as either a charge storing layer, as in a semiconductor-oxide-nitride-oxide-semiconductor (SONOS) transistor, or as an isolation layer between the floating gate and control gate, as in a split gate flash transistor.

DETAILED DESCRIPTION

A nonvolatile charge trap memory device and a method to form the same are described herein. In the following description, numerous specific details are set forth, such as specific dimensions, in order to provide a thorough understanding of embodiments of the present invention. It will be apparent to one skilled in the art that embodiments of the present invention may be practiced without these specific details. In other instances, well-known processing operations, such as patterning operations or wet chemical cleans, are not described in detail in order to not unnecessarily obscure embodiments of the present invention. Furthermore, it is to be understood that the various embodiments shown in the Figures are illustrative representations and are not necessarily drawn to scale.

Disclosed herein are nonvolatile charge trap memory devices and methods to form the same. In an embodiment, a method for fabricating a nonvolatile charge trap memory device is described. The method includes forming a first oxide layer on a surface of a substrate. The first oxide layer is exposed to a first decoupled plasma nitridation process having a first bias. Subsequently, a charge-trapping layer is formed on the first oxide layer. The charge-trapping layer is exposed to an oxidation process and then to a second decoupled plasma nitridation process having a second, different, bias. In another embodiment, a method for fabricating a nonvolatile charge trap memory device includes forming a, charge-trapping layer on a tunnel dielectric layer on a substrate. A first portion of a, blocking dielectric layer is formed on the charge-trapping layer. The first portion of the blocking dielectric layer is exposed to a steam environment. A second portion of the blocking dielectric layer is formed on the first portion of the blocking dielectric layer, the second portion having a higher dielectric constant than the first portion. The second portion of the blocking dielectric layer is then annealed. In yet another embodiment, a method for fabricating a nonvolatile charge trap memory device includes forming a tunnel dielectric layer on a substrate. By using a hydrogen-free silicon precursor, a first portion of a silicon oxy-nitride charge-trapping layer is formed on the tunnel dielectric layer. By using a hydrogen-containing silicon precursor, a second portion of the silicon oxy-nitride charge-trapping layer is formed on the first portion of the charge-trapping layer.

Figure 1:
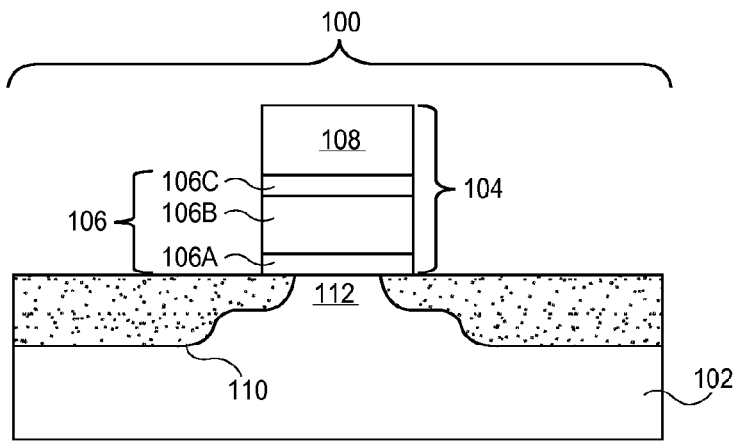
FIG. 1 illustrates a cross-sectional view of a nonvolatile charge trap memory device, in accordance with an embodiment of the present invention.

FIG. 1 illustrates a cross-sectional view of a nonvolatile charge trap memory device, in accordance with an embodiment of the present invention. Referring to FIG. 1, semiconductor device 100 includes a semiconductor-oxide-nitride-oxide-semiconductor (SONOS) gate stack 104 including an ONO portion 106 formed over a substrate 102. Semiconductor device 100 further includes source and drain regions 110 on either side of SONOS gate stack 104 to define a channel region 112. SONOS gate stack 104 includes a gate layer 108 formed above and in contact with ONO portion 106. Gate layer 108 is electrically isolated from silicon substrate 102 by ONO portion 106. In an embodiment, ONO portion 106 includes a tunnel dielectric layer 106A, a nitride or oxy-nitride charge-trapping layer 106B, and a top or blocking dielectric layer 106C overlying nitride or oxy-nitride layer 106B.

Figure 2:
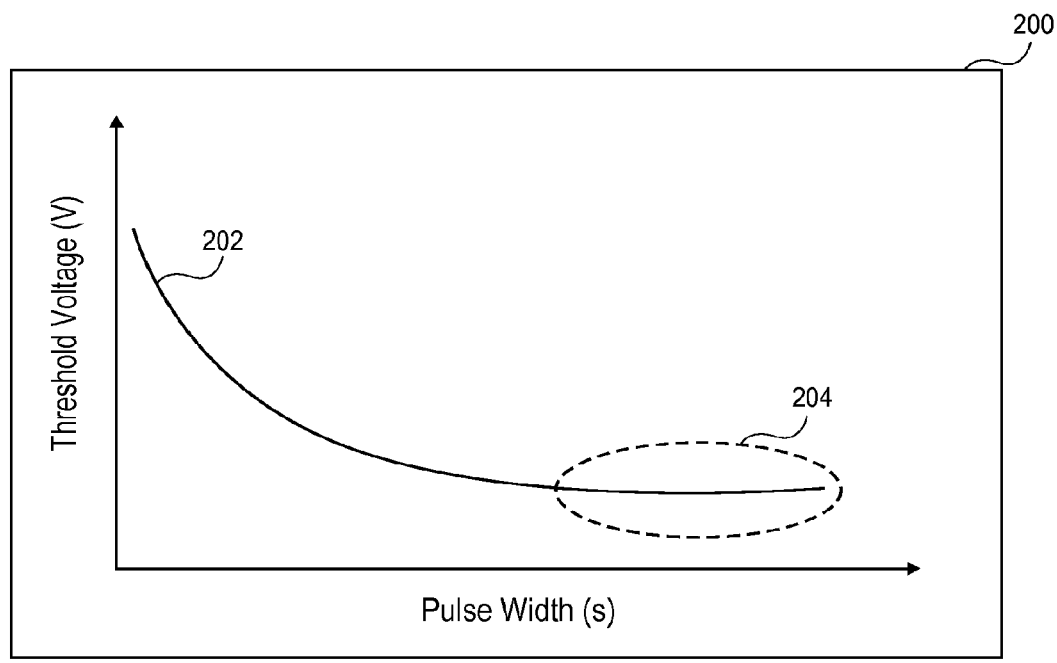
FIG. 2 is a plot of Threshold Voltage (V) as a function of Pulse Width (s) in erase mode for a nonvolatile charge trap memory device, in accordance with an embodiment of the present invention.

SONOS-type transistors may have limited program and erase windows achievable with some blocking layers 106C, inhibiting optimization of semi conductor device 100. For example, FIG. 2 is a plot 200 of Threshold Voltage (V) as a function of Pulse Width (s) in erase mode for a nonvolatile charge trap memory device, in accordance with an embodiment of the present invention. Referring to FIG. 2, line 202 is a measure of decreasing threshold voltage (in Volts) as a function of time (in seconds) in response to an erase-mode voltage being applied to a gate electrode in a SONOS transistor. As indicated by region 204 of line 202, the ability of the erase mode to decrease the threshold voltage of the gate electrode saturates with time, restricting an erase event to a relatively shallow erase of the gate electrode. The shallow erase limits the differential between erase and program modes for a SONOS-transistor and thus limits the performance of such a device.

Figure 3:
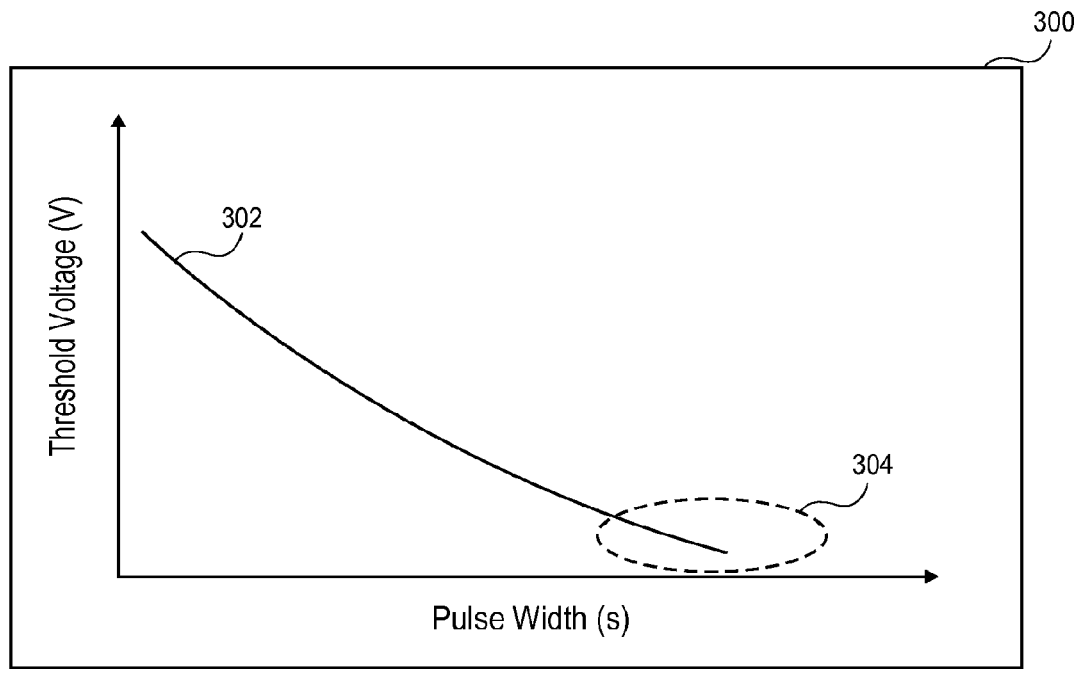
FIG. 3 is a plot of Threshold Voltage (V) as a function of Pulse Width (s) in erase mode for a nonvolatile charge trap memory device having a high dielectric constant blocking region, in accordance with an embodiment of the present invention.

A nonvolatile charge trap memory device including a high dielectric constant blocking region may exhibit a relatively large program and erase window, enabling increased performance of such a device. For example, in accordance with an embodiment of the present invention, FIG. 3 is a plot 300 of Threshold Voltage (V) as a function of Pulse Width (s) in erase mode for a nonvolatile charge trap memory device having a high dielectric constant blocking region. Referring to FIG. 3, line 302 is a measure of decreasing threshold voltage (in Volts) as a function of time (in seconds) in response to an erase-mode voltage being applied to a gate electrode in a nonvolatile charge trap memory transistor. As indicated by region 304 of line 302, the ability of the erase mode to decrease the threshold voltage of the gate electrode does not substantially saturate with time, allowing for a relatively deep erase of the gate electrode. In one embodiment, the deep erase enables a greater differential between erase and program modes for a nonvolatile charge trap memory transistor.

Figure 4A:
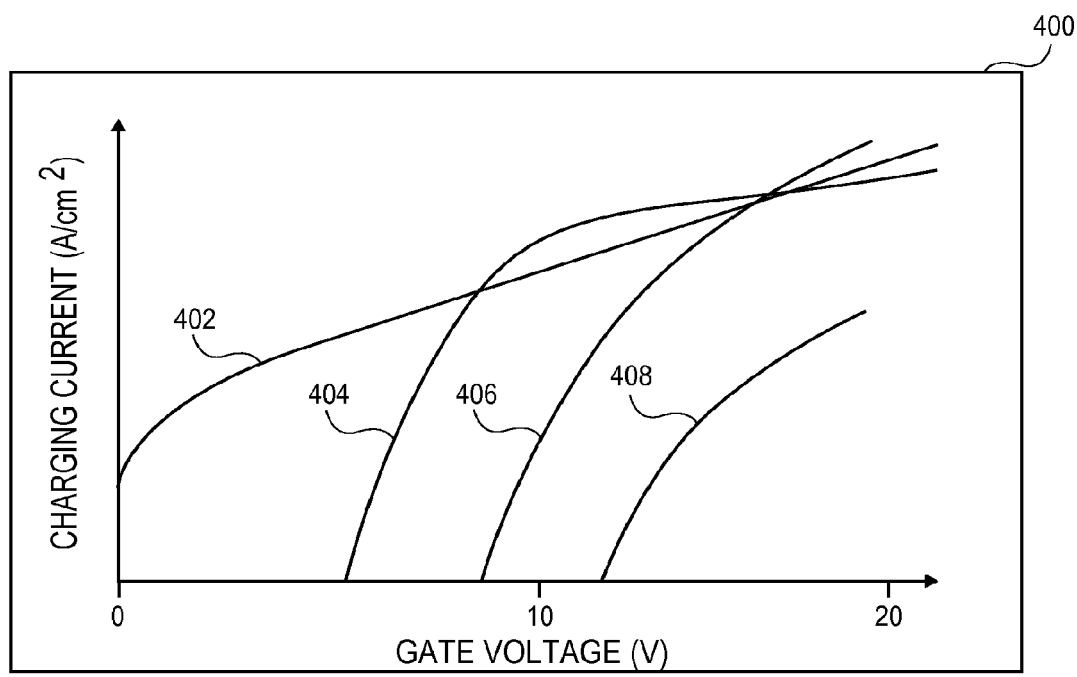
FIG. 4A is a plot of Charging Current ($A/cm^2$) as a function of Gate Voltage (V) for four different nonvolatile charge trap memory devices, in accordance with an embodiment of the present invention.

The ability to achieve a deep erase in a nonvolatile charge trap memory device including a high dielectric constant blocking region may result from the ability of the high dielectric constant blocking region to mitigate back-streaming of electrons. Such back-streaming otherwise proceeds into a charge-trapping layer that is subject to an erase-mode voltage application. For example, in accordance with an embodiment of the present invention, FIG. 4A is a plot 400 of Charging Current ($A/cm^2$) as a function of Gate Voltage (V) for four different nonvolatile charge trap memory devices. Referring to FIG. 4A, lines 402, 404, 406 and 408 are measures of increasing charging current ("back-streaming" in Amperes per square centimeter) as a function of gate voltage (in Volts) in response to an erase-mode voltage being applied to gate electrodes in a series of four nonvolatile charge trap memory transistors, respectively. Lines 402, 404, 406 and 408 represent data obtained from nonvolatile charge trap memory transistors having progressively physically thicker blocking dielectric layers, respectively, but all having approximately the same equivalent oxide thickness (EOT), i.e. the same electrical thickness. In one embodiment, the amount of gate voltage appropriate to produce a significant back-streaming event increases with increasing physical thickness of the blocking dielectric layer, as depicted in FIG. 4A. Thus, in a specific embodiment, the higher the dielectric constant of the blocking dielectric layer, the less back-streaming observed at a given voltage and at a given electrical thickness.

In comparison with a conventional memory device, in an embodiment, the reduction in back-streaming may enable a greater program and erase window, increasing the performance of a nonvolatile charge trap memory device at a given electrical thickness. However, the same effect may be exploited to scale down the electrical parameters of a nonvolatile charge trap memory device. For example, in accordance with an alternative embodiment of the present invention, a high dielectric constant blocking region has a smaller EOT than the blocking layer of a conventional memory device. In a specific alternative embodiment, a high dielectric constant blocking region has a smaller EOT than the blocking layer of a conventional memory device, and a nonvolatile charge trap memory device incorporating the high dielectric constant blocking region is operated at a lower gate voltage than the gate voltage used for the conventional memory device.

Figure 4B:
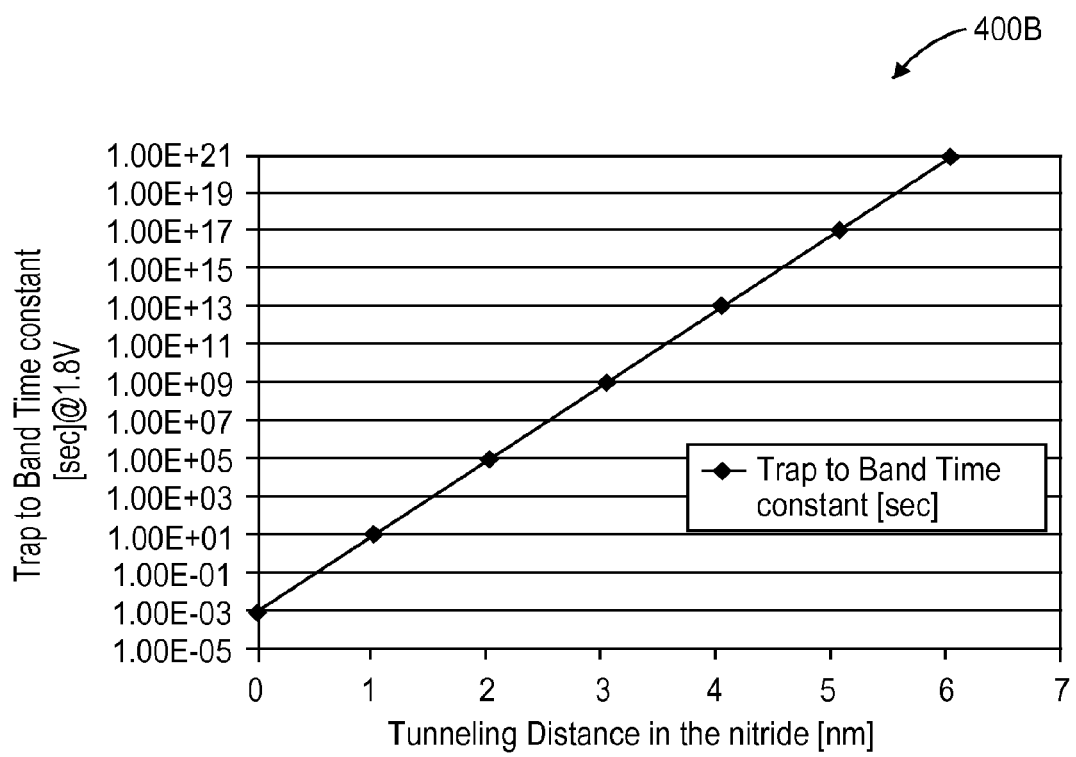
FIG. 4B is a plot of the Trap to Band Time Constant (in seconds) versus tunneling distance of nitrogen in a film (in nanometers), in accordance with an embodiment of the present invention.

Another option for increasing the overall device performance for a SONOS-type device may be the elimination of traps in the tunnel dielectric layer of such a device. For example, in accordance with an embodiment of the present invention, nitrogen atoms derived from a decoupled or remote source plasma are embedded or implanted into the tunnel dielectric layer. Referring to FIG. 4B, a plot 400B illustrates the Trap to Band Time Constant (in seconds) versus tunneling distance of nitrogen in a film (in nanometers), in accordance with an embodiment of the present invention. Referring to plot 400B, the greater the extent of nitridization, the more robust the film for tunneling.

Figure 5:
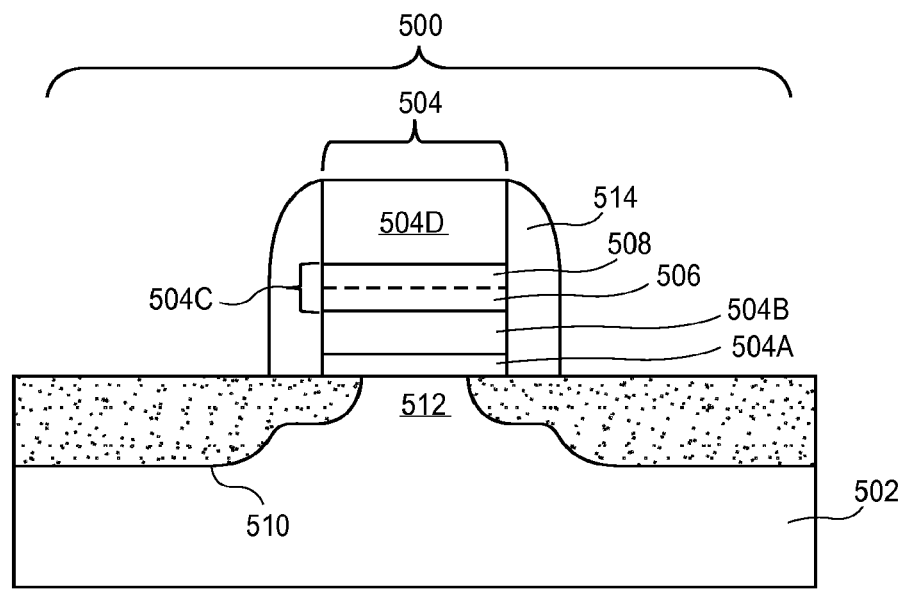
FIG. 5 illustrates a cross-sectional view of a nonvolatile charge trap memory device having a multi-layer high dielectric constant blocking region, in accordance with an embodiment of the present invention.

A nonvolatile charge trap memory device may include a multi-layer blocking dielectric region. FIG. 5 illustrates a cross-sectional view of a nonvolatile charge trap memory device having a multi-layer high dielectric constant blocking region, in accordance with an embodiment of the present invention.

Referring to FIG. 5, semiconductor device 500 includes a gate stack 504 formed over a substrate 502. Semiconductor device 500 further includes source and drain regions 510 in substrate 502 on either side of gate stack 504, defining a channel region 512 in substrate 502 underneath gate stack 504. Gate stack 504 includes a tunnel dielectric layer 504A, a charge-trapping layer 504B, a multi-layer blocking dielectric region 504C, and a gate layer 504D. Thus, gate layer 504D is electrically isolated from substrate 502. Multi-layer blocking dielectric region 504C includes a first dielectric layer 506 disposed above charge-trapping layer 504B and a second dielectric layer 508 disposed above first dielectric layer 506 and below gate layer 504D. A pair of dielectric spacers 514 isolates the sidewalls of gate stack 504.

Semiconductor device 500 may be a nonvolatile charge trap memory device. In one embodiment, semiconductor device 500 is a Flash-type device wherein the charge-trapping layer is a conductor layer or a semiconductor layer. In accordance with another embodiment of the present invention, semiconductor device 500 is a SONOS-type device wherein the charge-trapping layer is an insulator layer. By convention, SONOS stands for "Semiconductor-Oxide-Nitride-Oxide-Semiconductor," where the first "Semiconductor" refers to the channel region material, the first "Oxide" refers to the tunnel dielectric layer, "Nitride" refers to the charge-trapping dielectric layer, the second "Oxide" refers to the blocking dielectric layer and the second "Semiconductor" refers to the gate layer. A SONOS-type device, however, is not limited to these specific materials, as described below.

Substrate 502 and, hence, channel region 512, may be composed of a material suitable for semiconductor device fabrication. In one embodiment, substrate 502 is a bulk substrate composed of a single crystal of a material which may include, but is not limited to, silicon, germanium, silicon-germanium or a III-V compound semiconductor material. In another embodiment, substrate 502 includes a bulk layer with a top epitaxial layer. In a specific embodiment, the bulk layer is composed of a single crystal of a material which may include, but is not limited to, silicon, germanium, silicon-germanium, a III-V compound semiconductor material and quartz, while the top epitaxial layer is composed of a single crystal layer which may include, but is not limited to, silicon, germanium, silicon-germanium or a III-V compound semiconductor material. In another embodiment, substrate 502 includes a top epitaxial layer on a middle insulator layer which is above a lower bulk layer. The top epitaxial layer is composed of a single crystal layer which may include, but is not limited to, silicon (i.e. to form a silicon-on-insulator (SOI) semiconductor substrate), germanium, silicon-germanium or a III-V compound semiconductor material. The insulator layer is composed of a material which may include, but is not limited to, silicon dioxide, silicon nitride or silicon oxy-nitride. The lower bulk layer is composed of a single crystal which may include, but is not limited to, silicon, germanium, silicon-germanium, a II-V compound semiconductor material or quartz. Substrate 502 and, hence, channel region 512, may include dopant impurity atoms. In a specific embodiment, channel region 512 is doped P-type and, in an alternative embodiment, channel region 512 is doped N-type.

Source and drain regions 510 in substrate 502 may be regions having opposite conductivity to channel region 512. For example, in accordance with an embodiment of the present invention, source and drain regions 510 are N-type doped regions while channel region 512 is a P-type doped region. In one embodiment, substrate 502 and, hence, channel region 512, is composed of boron-doped single-crystal silicon having a boron concentration in the range of $1 \times 10^{15}$-$1 \times 10^{19}$ atoms/cm$^3$. In that embodiment, source and drain regions 510 are composed of phosphorous- or arsenic-doped regions having a concentration of N-type dopants in the range of $5 \times 10^{16}$-$5 \times 10^{19}$ atoms/cm$^3$. In a specific embodiment, source and drain regions 510 have a depth in substrate 502 in the range of 80-200 nanometers. In accordance with an alternative embodiment of the present invention, source and drain regions 510 are P-type doped regions while channel region 512 is an N-type doped region.

Tunnel dielectric layer 504A may be a material and have a thickness suitable to allow charge carriers to tunnel into the charge-trapping layer under an applied gate bias while maintaining a suitable barrier to leakage when the device is unbiased. In one embodiment, tunnel dielectric layer 504A is formed by a thermal oxidation process and is composed of silicon dioxide or silicon oxy-nitride, or a combination thereof. In another embodiment, tunnel dielectric layer 504A is formed by chemical vapor deposition or atomic layer deposition and is composed of a dielectric layer which may include, but is not limited to, silicon nitride, aluminum oxide, hafnium oxide, zirconium oxide, hafnium silicate, zirconium silicate, hafnium oxy-nitride, hafnium zirconium oxide or lanthanum oxide. In another embodiment, tunnel dielectric layer 504A is a bi-layer dielectric region including a bottom layer of a material such as, but not limited to, silicon dioxide or silicon oxy-nitride and a top layer of a material which may include, but is not limited to, silicon nitride, aluminum oxide, hafnium oxide, zirconium oxide, hafnium silicate, zirconium silicate, hafnium oxy-nitride, hafnium zirconium oxide or lanthanum oxide. Thus, in one embodiment, tunnel dielectric layer 504A includes a high-K dielectric portion. In a specific embodiment, tunnel dielectric layer 504A has a thickness in the range of 1-10 nanometers.

Charge-trapping layer 504B may be a material and have a thickness suitable to store charge and, hence, raise the threshold voltage of gate stack 504. In accordance with an embodiment of the present invention, charge-trapping layer 504B is formed by a chemical vapor deposition process and is composed of a dielectric material which may include, but is not limited to, stoichiometric silicon nitride, silicon-rich silicon nitride or silicon oxy-nitride. In one embodiment, charge-trapping layer 504B is composed of a bi-layer silicon oxy-nitride region. For example, in a specific embodiment, charge-trapping layer 504B includes an oxygen-rich portion and a silicon-rich portion and is formed by depositing an oxygen-rich oxy-nitride film by a first composition of gases and, subsequently, depositing a silicon-rich oxy-nitride film by a second composition of gases. In a particular embodiment, charge-trapping layer 504B is formed by modifying the flow rate of ammonia ($NH_3$) gas, and introducing nitrous oxide ($N_2O$) and dichlorosilane ($SiH_2Cl_2$) to provide the appropriate gas ratios to yield first an oxygen-rich oxy-nitride film and then a silicon-rich oxy-nitride film. In one embodiment, charge-trapping layer 504B has a thickness in the range of 5-10 nanometers. In accordance with an alternative embodiment of the present invention, charge-trapping layer 504B has a graded composition.

In accordance with an embodiment of the present invention, charge-trapping layer 504B is formed by a chemical vapor deposition process and is composed of a material such as, but not limited to, silicon nitride, silicon oxy-nitride, or variable stoichiometries thereof. In one embodiment, charge-trapping layer 504B is formed on tunnel dielectric layer 504A in a single-wafer low-pressure chemical vapor deposition chamber, such as the SiNgen™ single-wafer low-pressure chemical vapor deposition chamber described in association with FIG. 11. In a specific embodiment, the second process chamber is a single-wafer low-pressure chemical vapor deposition chamber and charge-trapping layer 504B is formed at a temperature less than the temperature used to form tunnel dielectric layer 504A. In another specific embodiment, the second process chamber is a single-wafer low-pressure chemical vapor deposition chamber and charge-trapping layer 504B is formed at a temperature approximately in the range of 700-850 degrees Celsius. In another specific embodiment, the second process chamber is a single-wafer low-pressure chemical vapor deposition chamber and charge-trapping layer 504B is formed at a temperature approximately in the range of 750-780 degrees Celsius and has an increased charge-retention capacity. In a particular embodiment, the second process chamber is a single-wafer low-pressure chemical vapor deposition chamber and charge-trapping layer 504B is formed by using gases such as, but not limited to, dichlorosilane ($H_2SiCl_2$), bis-(tert-butylamino)silane (BTBAS), anunonia ($NH_3$) or nitrous oxide ($N_2O$). In one embodiment, charge-trapping layer 504B is formed to a thickness approximately in the range of 8-10 nanometers.

Alternatively, charge-trapping layer 504B may include multiple composition regions. For example, in accordance with an embodiment of the present invention, charge-trapping layer 504B includes an oxygen-rich portion and a silicon-rich portion and is formed by depositing an oxygen-rich oxy-nitride film by a first composition of gases in the second process chamber and, subsequently, depositing a silicon-rich oxy-nitride film by a second composition of gases in the second process chamber. In one embodiment, charge-trapping layer 504B is formed by modifying the flow rate of ammonia ($NH_3$) gas, and introducing nitrous oxide ($N_2O$) and dichlorosilane ($SiH_2Cl_2$) to provide the appropriate gas ratios to yield first an oxygen-rich oxy-nitride film and then a silicon-rich oxy-nitride film. In a specific embodiment, the oxygen-rich oxy-nitride film is formed by introducing a process gas including $N_2O$, $NH_3$ and $SiH_2Cl_2$, while maintaining the chamber at a pressure of from about 5 millitorr (mT) to about 500 mT, and maintaining the substrate at a temperature of from about 700° C. to about 850° C. and more preferably at least about 780° C., for a period of from about 2.5 minutes to about 20 minutes. In a further embodiment, the process gas can include a gas mixture of $N_2O$ and $NH_3$ mixed in a ratio of from about 8:1 to about 1:8 and $SiH_2Cl_2$ and $NH_3$ mixed in a ratio of from about 1:7 to about 7:1, and can be introduced at a flow rate of from about 5 to about 200 standard cubic centimeters per minute (sccm). In another specific embodiment, the silicon-rich oxy-nitride film is formed by introducing a process gas including $N_2O$, $NH_3$ and $SiH_2Cl_2$, while maintaining the chamber at a pressure of from about 5 millitorr (mT) to about 500 mT, and maintaining the substrate at a temperature of from about 700° C. to about 850° C. and more preferably at least about 780° C., for a period of from about 2.5 minutes to about 20 minutes. In a further embodiment, can include a gas mixture of $N_2O$ and $NH_3$ mixed in a ratio of from about 8:1 to about 1:8 and $SiH_2Cl_2$ and $NH_3$ mixed in a ratio of from about 1:7 to about 7:1, introduced at a flow rate of from about 5 to about 20 sccm.

Additionally, in forming charge-trapping layer 504B having multiple composition regions, an anneal operation may be carried out between the deposition of the oxygen-rich oxy-nitride film and the deposition of the silicon-rich oxy-nitride film. In an embodiment, this anneal operation is possible because the oxygen-rich oxy-nitride film is maintained in the environment within a single-wafer tool and thus retains a pristine surface. In one embodiment, charge-trapping layer 504B is formed by first depositing an oxygen-rich oxy-nitride film in the second process chamber, then annealing the oxygen-rich oxy-nitride film in the first process chamber and, finally, depositing a silicon-rich oxy-nitride film in the second process chamber. This ordering of operations may be used in the case where the second process chamber is a single-wafer low-pressure chemical vapor deposition chamber maintained at non-optimal temperatures for the anneal operation, such as the optimal temperatures maintained in the first process chamber. In a specific embodiment, the annealing includes heating in an atmosphere including nitrogen at a temperature approximately in the range of 900-1100 degrees Celsius for a duration approximately in the range of 30 seconds-60 seconds. In a particular embodiment, the atmosphere including nitrogen is composed of a gas such as, but not limited to, nitrogen ($N_2$), nitrous oxide ($N_2O$), nitrogen dioxide ($NO_2$), nitric oxide (NO) or ammonia ($NH_3$).

Multi-layer blocking dielectric region 504C may be composed of a material and have a thickness suitable to maintain a barrier to charge leakage without significantly decreasing the capacitance of gate stack 504. In accordance with an embodiment of the present invention, multi-layer blocking dielectric region 504C is a bi-layer blocking dielectric region having a first dielectric layer 506 disposed directly above charge-trapping layer 504B and having a second dielectric layer 508 disposed directly above first dielectric layer 506 and directly below gate layer 504D. In an embodiment, first dielectric layer 506 has a large barrier height while second dielectric layer 508 has a high dielectric constant. In one embodiment, the barrier height of first dielectric layer 506 is at least approximately 2 electron Volts (eV). In a specific embodiment, the barrier height of first dielectric layer 506 is at least approximately 3 eV. In an embodiment, the dielectric constant of first dielectric layer 506 is lower than the dielectric constant of second dielectric layer 508. In one embodiment, first dielectric layer 506 of bi-layer blocking dielectric region 504C is composed of silicon dioxide and second dielectric layer 508 is composed of silicon nitride. In another embodiment, first dielectric layer 506 of bi-layer blocking dielectric region 504C is composed of silicon dioxide and second dielectric layer 508 is composed of a material such as, but not limited to, aluminum oxide, hafnium oxide, zirconium oxide, hafnium silicate, zirconium silicate, hafnium oxy-nitride, hafnium zirconium oxide or lanthanum oxide. In a specific embodiment, first dielectric layer 506 of bi-layer blocking dielectric region 504C is composed of a material having a dielectric constant approximately in the range of 3.5-4.5 and second dielectric layer 508 is composed of a material having a dielectric constant above approximately 7. In accordance with an embodiment of the present invention, multi-layer blocking dielectric region 504C is formed in part by a chemical vapor deposition process. In one embodiment, multi-layer blocking dielectric region 504C is formed from at least two different materials. In a specific embodiment, forming multi-layer blocking dielectric region 504C from at least two different materials includes oxidizing a top portion of charge-trapping layer 504B and, subsequently, depositing a dielectric layer above the oxidized portion of charge-trapping layer 5041B. In another specific embodiment, forming graded blocking dielectric layer 504C from at least two different materials includes depositing a first dielectric layer having a first dielectric constant and, subsequently, depositing a second dielectric layer having a second dielectric constant, wherein the second dielectric constant is greater than the first dielectric constant. In a particular embodiment, the first dielectric layer has a thickness approximately in the range of 0.5-3 nanometers, the second dielectric layer has a thickness approximately in the range of 2-5 nanometers, and the first and second dielectric layers are not inter-mixed. Thus, in accordance with an embodiment of the present invention, multi-layer blocking dielectric region 504C has an abrupt interface between first dielectric layer 506 and second dielectric layer 508, as depicted in FIG. 5.

Gate layer 504D may be composed of a conductor or semiconductor material suitable for accommodating a bias during operation of a SONOS-type transistor. In accordance with an embodiment of the present invention, gate layer 504D is formed by a chemical vapor deposition process and is composed of doped poly-crystalline silicon. In another embodiment, gate layer 504D is formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt or nickel. In one embodiment, gate layer 504D is a high work-function gate layer.

Figure 6:
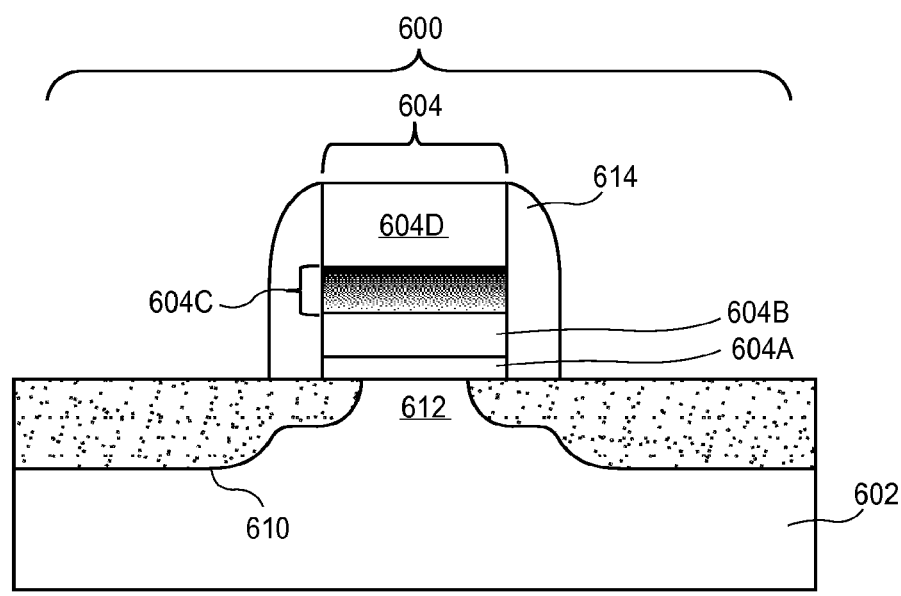
FIG. 6 illustrates a cross-sectional view of a nonvolatile charge trap memory device having a graded high dielectric constant blocking layer, in accordance with an embodiment of the present invention.

In another aspect, a nonvolatile charge trap memory device may include a graded blocking dielectric layer. FIG. 6 illustrates a cross-sectional view of a nonvolatile charge trap memory device having a graded high dielectric constant blocking layer, in accordance with an embodiment of the present invention.

Referring to FIG. 6, semiconductor device 600 includes a gate stack 604 formed over a substrate 602. Semiconductor device 600 further includes source and drain regions 610 in substrate 602 on either side of gate stack 604, defining a channel region 612 in substrate 602 underneath gate stack 604. Gate stack 604 includes a tunnel dielectric layer 604A, a charge-trapping layer 604B, a graded blocking dielectric layer 604C, and a gate layer 604D. Thus, gate layer 604D is electrically isolated from substrate 602. A pair of dielectric spacers 614 isolates the sidewalls of gate stack 604.

Semiconductor device 600 may be a semiconductor device described in association with semiconductor device 500 from FIG. 5. Substrate 602, source and drain regions 610 and channel region 612 may be composed of any material and dopant impurity atoms described in association with substrate 502, source and drain regions 510 and channel region 512, respectively, from FIG. 5. Tunnel dielectric layer 604A, charge-trapping layer 604B and gate layer 604D may be composed of any material described in association with tunnel dielectric layer 504A, charge-trapping layer 504B and gate layer 504D, respectively, from FIG. 5.

However, in contrast to semiconductor device 500, semiconductor device 600 includes a graded blocking dielectric layer 604C, as depicted in FIG. 6. In accordance with an embodiment of the present invention, graded blocking dielectric layer 604C is disposed directly above charge-trapping layer 604B and directly below gate layer 604D. In an embodiment, the portion of graded blocking dielectric layer 604C directly adjacent to charge-trapping layer 604B has a large barrier height while the portion of graded blocking dielectric layer 604C directly adjacent to gate layer 604D has a high dielectric constant. In one embodiment, the barrier height of the portion of graded blocking dielectric layer 604C directly adjacent to charge-trapping layer 604B is at least approximately 2 eV. In a specific embodiment, the barrier height of the portion of graded blocking dielectric layer 604C directly adjacent to charge-trapping layer 604B is at least approximately 3 eV. In an embodiment, the dielectric constant of graded blocking dielectric layer 604C has a low-to-high gradient in the direction from charge-trapping layer 604B to gate layer 604D. In one embodiment, the portion of graded blocking dielectric layer 604C directly adjacent to charge-trapping layer 604B is composed substantially of silicon dioxide and the portion of graded blocking dielectric layer 604C directly adjacent to gate layer 604D is composed substantially of silicon nitride. In another embodiment, the portion of graded blocking dielectric layer 604C directly adjacent to charge-trapping layer 604B is composed substantially of silicon dioxide and the portion of graded blocking dielectric layer 604C directly adjacent to gate layer 604D is composed substantially of a material such as, but not limited to, aluminum oxide, hafnium oxide, zirconium oxide, hafnium silicate, zirconium silicate, hafnium oxy-nitride, hafnium zirconium oxide or lanthanum oxide. In a specific embodiment, the portion of graded blocking dielectric layer 604C directly adjacent to charge-trapping layer 604B is composed substantially of a material having a dielectric constant approximately in the range of 3.5-4.5 and the portion of graded blocking dielectric layer 604C directly adjacent to gate layer 604D is substantially composed of a material having a dielectric constant above approximately 7. In accordance with an embodiment of the present invention, graded blocking dielectric layer 604C is formed in part by a chemical vapor deposition process. In one embodiment, graded blocking dielectric layer 604C is formed from at least two different materials. In a specific embodiment, forming graded blocking dielectric layer 604C from at least two different materials includes oxidizing a top portion of charge-trapping layer 604B and, subsequently, depositing a dielectric layer above the oxidized portion of charge-trapping layer 604B. In another specific embodiment, forming graded blocking dielectric layer 604C from at least two different materials includes depositing a first dielectric layer having a first dielectric constant and, subsequently, depositing a second dielectric layer having a second dielectric constant, wherein the second dielectric constant is greater than the first dielectric constant. In a particular embodiment, the first dielectric layer has a thickness approximately in the range of 0.5-3 nanometers, the second dielectric layer has a thickness approximately in the range of 2-5 nanometers, and the first and second dielectric layers are then inter-mixed. In one embodiment, the first and second dielectric layers are inter-mixed upon deposition of the second dielectric layer on the first dielectric layer. In another embodiment, the first and second dielectric layers are inter-mixed in an anneal process subsequent to the formation of the first and second dielectric layers. Thus, in accordance with an embodiment of the present invention, there is no distinct interface within graded blocking dielectric layer 604C, as depicted in FIG. 6.

A nonvolatile charge trap memory device may be fabricated to include a multi-layer blocking dielectric region. FIGS. 7A-7I illustrate cross-sectional views representing operations in the formation of a nonvolatile charge trap memory device having a multi-layer high dielectric constant blocking region, in accordance with an embodiment of the present invention.

Figure 7A:
FIG. 7A illustrates a cross-sectional view representing an operation in the formation of a nonvolatile charge trap memory device having a multi-layer high dielectric constant blocking region, in accordance with an embodiment of the present invention.
Figure 7B:
FIG. 7B illustrates a cross-sectional view representing an operation in the formation of a nonvolatile charge trap memory device having a multi-layer high dielectric constant blocking region, in accordance with an embodiment of the present invention.
Figure 7C:
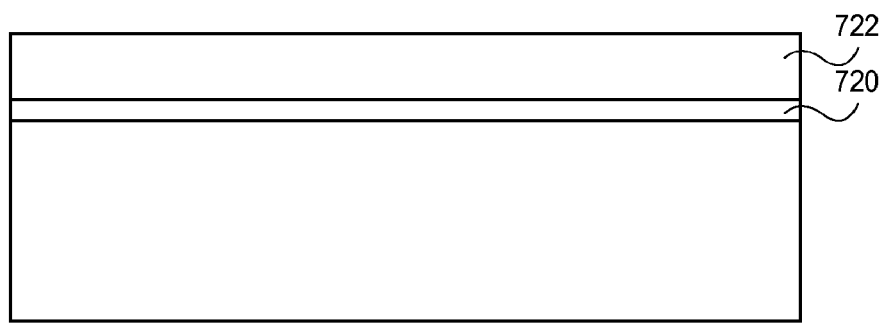
FIG. 7C illustrates a cross-sectional view representing an operation in the formation of a nonvolatile charge trap memory device having a multi-layer high dielectric constant blocking region, in accordance with an embodiment of the present invention.

Referring to FIG. 7A, a substrate 702 is provided. Substrate 702 may be composed of a material and have characteristics described in association with substrate 502 from FIG. 5. Referring to FIG. 7B, a tunnel dielectric layer 720 is formed on the top surface of substrate 702. Tunnel dielectric layer 720 may be formed from any material, from any process, and have any thickness described in association with tunnel dielectric layer 504A from FIG. 5. Referring to FIG. 7C, a charge-trapping 722 is formed on the top surface of tunnel dielectric layer 720. Charge-trapping layer 722 may be formed from any material, from any process, and have any thickness described in association with charge-trapping layer 504B from FIG. 5.

Figure 7D:
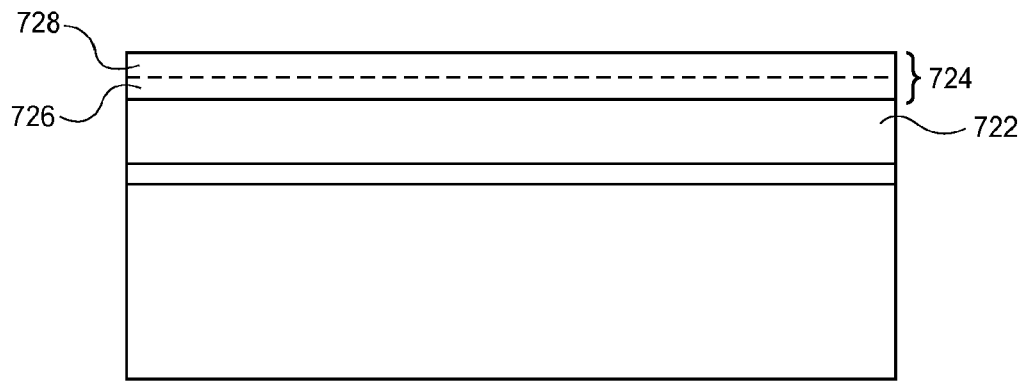
FIG. 7D illustrates a cross-sectional view representing an operation in the formation of a nonvolatile charge trap memory device having a multi-layer high dielectric constant blocking region, in accordance with an embodiment of the present invention.

Referring to FIG. 7D, a multi-layer blocking dielectric region 724 is formed on the top surface of charge-trapping layer 722. Multi-layer blocking dielectric region 724 includes a first dielectric layer 726 disposed above charge-trapping layer 722 and a second dielectric layer 728 disposed above first dielectric layer 726. In accordance with an embodiment of the present invention, multi-layer blocking dielectric region 724 is a bi-layer blocking dielectric region and includes a first dielectric layer 726 and a second dielectric layer 728, as depicted in FIG. 7D. First dielectric layer 726 and second dielectric layer 728 may be formed by any technique, composed of any materials, and have any thicknesses described in association with first dielectric layer 506 and second dielectric layer 508, respectively, from FIG. 5. In accordance with an embodiment of the present invention, multi-layer blocking dielectric region 724 has an abrupt interface between first dielectric layer 726 and second dielectric layer 728, as depicted in FIG. 7D. In one embodiment, multi-layer blocking dielectric region 724 is formed from at least two different materials. In a specific embodiment, forming multi-layer blocking dielectric region 724 from at least two different materials includes oxidizing a top portion of charge-trapping layer 722 and, subsequently, depositing a dielectric layer above the oxidized portion of charge-trapping layer 724. In another specific embodiment, forming multi-layer blocking dielectric region 724 from at least two different materials includes depositing a first dielectric layer having a first dielectric constant and, subsequently, depositing a second dielectric layer having a second dielectric constant, wherein the second dielectric constant is greater than the first dielectric constant.

Figure 7E:
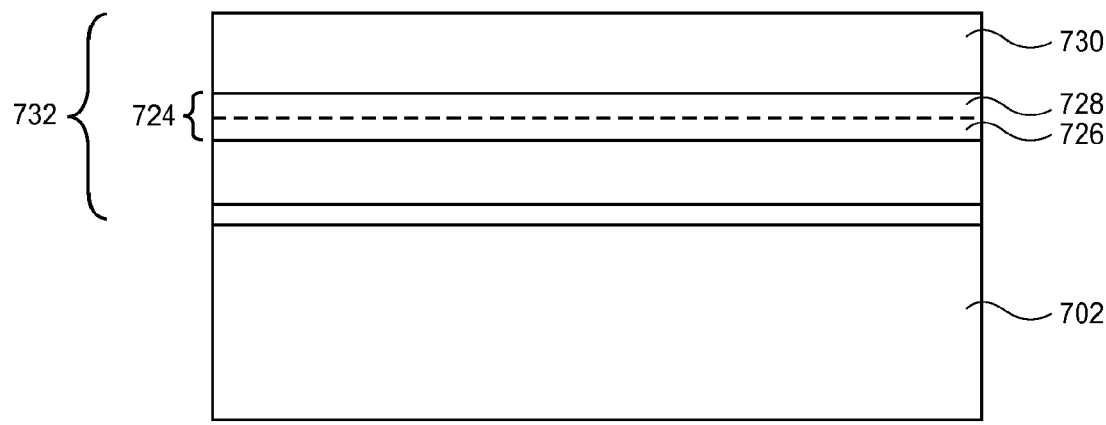
FIG. 7E illustrates a cross-sectional view representing an operation in the formation of a nonvolatile charge trap memory device having a multi-layer high dielectric constant blocking region, in accordance with an embodiment of the present invention.

Referring to FIG. 7E, a gate layer 730 is formed on the top surface of multi-layer blocking dielectric region 724. Gate layer 730 may be formed from any material and from any process described in association with gate layer 504D) from FIG. 5. Thus, a gate stack 732 may be formed above substrate 702.

Figure 7F:
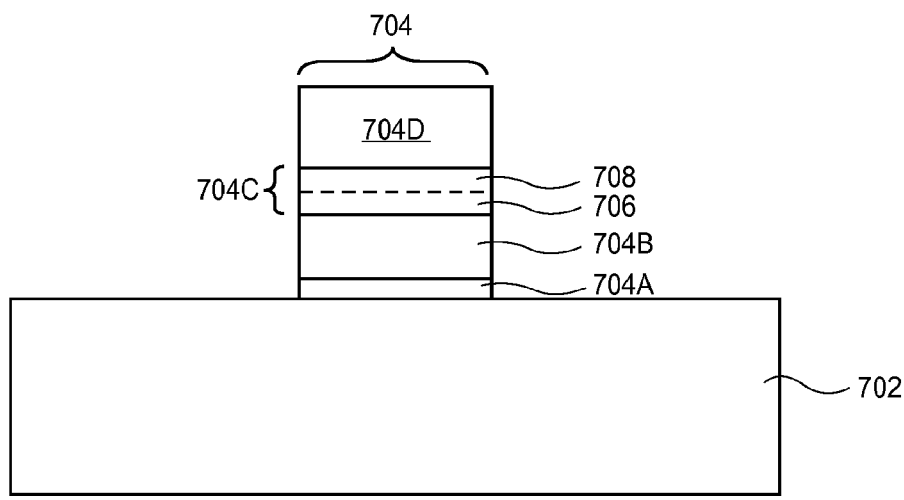
FIG. 7F illustrates a cross-sectional view representing an operation in the formation of a nonvolatile charge trap memory device having a multi-layer high dielectric constant blocking region, in accordance with an embodiment of the present invention.

Referring to FIG. 7F, gate stack 732 is patterned to form a patterned gate stack 704 above substrate 702. Patterned gate stack 704 includes a patterned tunnel dielectric layer 704A, a patterned charge-trapping layer 704B, a patterned multi-layer blocking dielectric region 704C, and a patterned gate layer 704D. Patterned multi-layer blocking dielectric region 704C includes a patterned first dielectric layer 706 and a patterned second dielectric layer 708. Gate stack 732 may be patterned to form patterned gate stack 704 by arty process suitable to provide substantially vertical sidewalls for gate stack 704 with high selectivity to substrate 702. In accordance with an embodiment of the present invention, gate stack 732 is patterned to form patterned gate stack 704 by a lithography and etch process. In a specific embodiment, the etch process is an anisotropic etch process utilizing gases such as, but not limited to, carbon tetrafluoride ($CF_4$), $O_2$, hydrogen bromide (HBr) and chlorine ($Cl_2$).

Figure 7G:
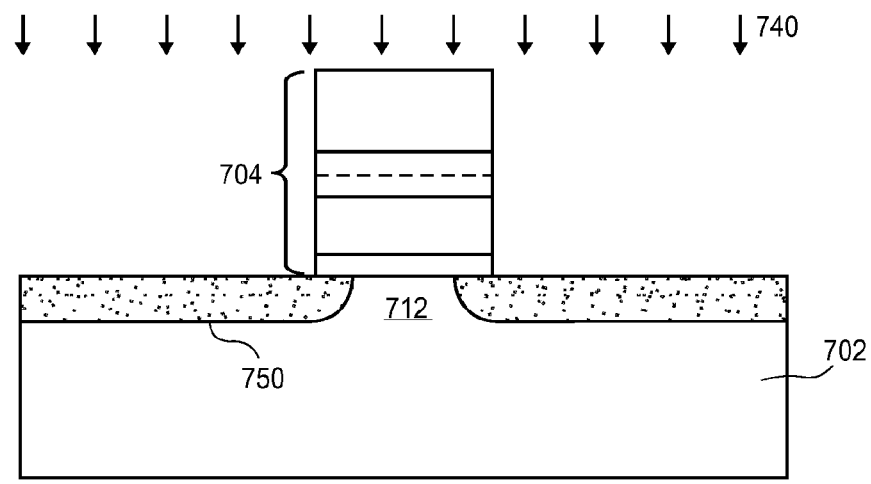
FIG. 7G illustrates a cross-sectional view representing an operation in the formation of a nonvolatile charge trap memory device having a multi-layer high dielectric constant blocking region, in accordance with an embodiment of the present invention.

Referring to FIG. 7G, it may be appropriate to implant dopant impurity atoms 740 into the exposed portions of substrate 704 to form source and drain tip extension regions 750. Source and drain tip extension regions 750 will ultimately become part of source and drain regions formed subsequently, as described below. Thus, by forming source and drain tip extension regions 750 as defined by the location of patterned gate stack 704, channel region 712 may be defined, as depicted in FIG. 7G. In one embodiment, the conductivity type and the concentration of dopant impurity atoms used to form source and drain tip extension regions 750 are substantially the same as those used to form source and drain regions, described below.

Figure 7H:
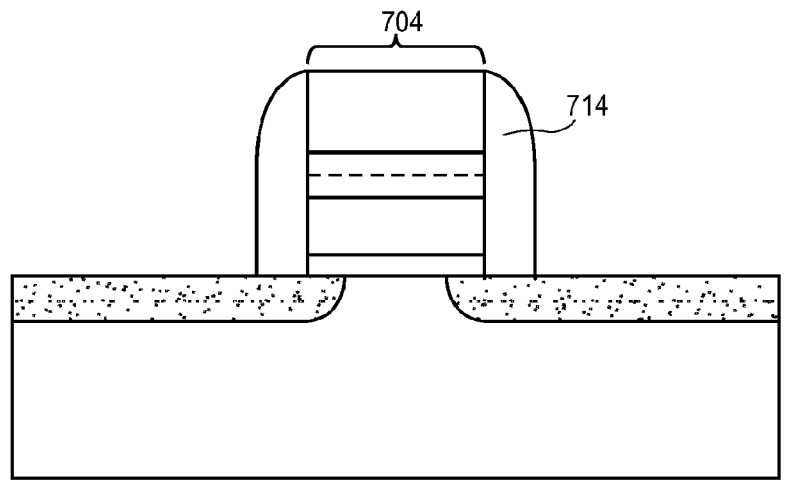
FIG. 7H illustrates a cross-sectional view representing an operation in the formation of a nonvolatile charge trap memory device having a multi-layer high dielectric constant blocking region, in accordance with an embodiment of the present invention.
Figure 7I:
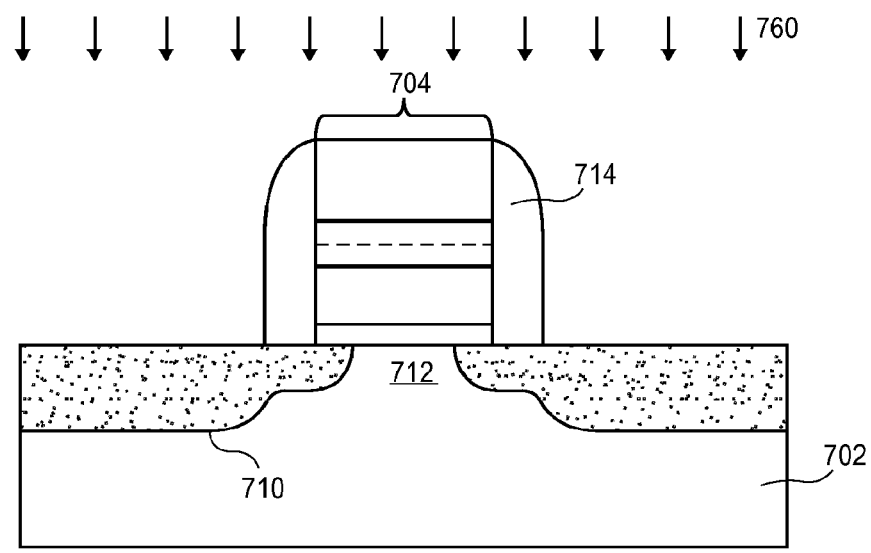
FIG. 7I illustrates a cross-sectional view representing an operation in the formation of a nonvolatile charge trap memory device having a multi-layer high dielectric constant blocking region, in accordance with an embodiment of the present invention.

Referring to FIG. 7H, it may be appropriate to form a pair of dielectric spacers 714 on the sidewalls of patterned gate stack 704, as is well-known in the art. Finally, referring to FIG. 7I, source and drain regions 710 are formed by implanting dopant impurity atoms 760 into the exposed portions of substrate 704. Source and drain regions 710 may have any characteristics as those described in association with source and drain regions 510 from FIG. 5. In accordance with an embodiment of the present invention, the profile of source and drain regions 710 is defined by dielectric spacers 714, patterned gate stack 704 and source and drain tip extension regions 750, as depicted in FIG. 7I.

Figure 8A:
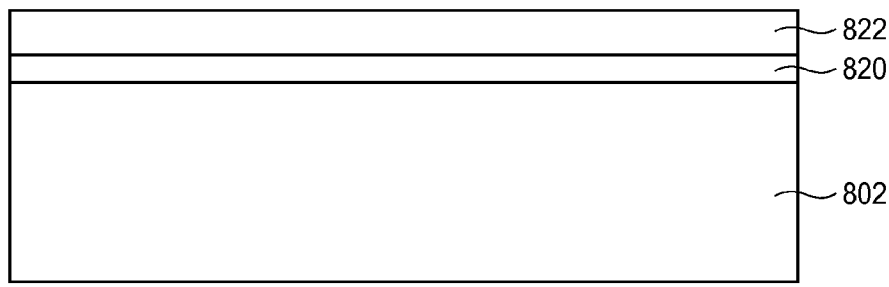
FIG. 8A illustrates a cross-sectional view representing an operation in the formation of a nonvolatile charge trap memory device having a graded high dielectric constant blocking layer, in accordance with an embodiment of the present invention.
Figure 8B:
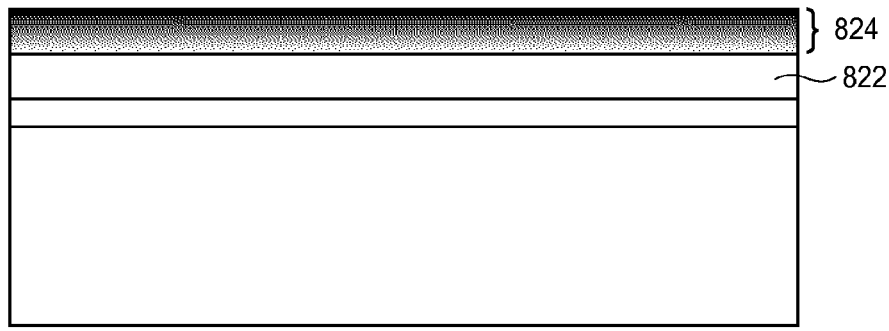
FIG. 8B illustrates a cross-sectional view representing an operation in the formation of a nonvolatile charge trap memory device having a graded high dielectric constant blocking layer, in accordance with an embodiment of the present invention.
Figure 8C:
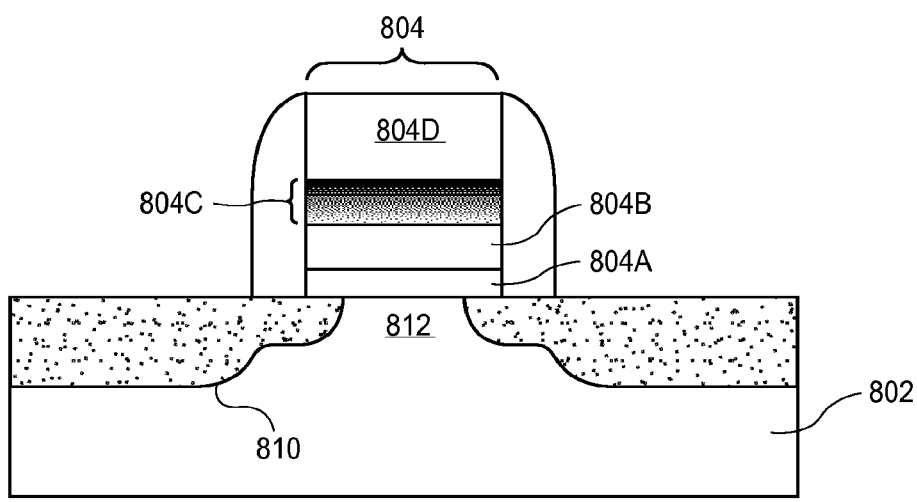
FIG. 8C illustrates a cross-sectional view representing an operation in the formation of a nonvolatile charge trap memory device having a graded high dielectric constant blocking layer, in accordance with an embodiment of the present invention.

In another embodiment, a nonvolatile charge trap memory device is fabricated to include a graded blocking dielectric layer. FIGS. 8A-8C illustrate cross-sectional views representing operations in the formation of a nonvolatile charge trap memory device having a graded high dielectric constant blocking layer, in accordance with an embodiment of the present invention.

Referring to FIG. 8A, a charge-trapping layer 822 and a tunnel dielectric layer 820, formed on the top surface of a substrate 802, are provided. Substrate 802 may be composed of any material and have any characteristics described in association with substrate 602 from FIG. 6. Charge-trapping layer 822 and tunnel dielectric layer 820 may be formed from any material, from any process, and have any thickness described in association with charge-trapping layer 604B and tunnel dielectric layer 604A, respectively, from FIG. 6.

Referring to FIG. 81B, a graded blocking dielectric layer 824 is formed on the top surface of charge-trapping layer 822. In accordance with an embodiment of the present invention, graded blocking dielectric layer 824 is formed directly above charge-trapping layer 822, as depicted in FIG. 8B. In one embodiment, graded blocking dielectric layer 824 has a low-to-high gradient in the direction from charge-trapping layer 822 to the top surface of graded blocking dielectric layer 824. Graded blocking dielectric layer 824 may be formed by any technique, composed of any materials, and have any thicknesses described in association with graded blocking dielectric layer 604C from FIG. 6. In accordance with an embodiment of the present invention, there is no distinct interface within graded blocking dielectric layer 824, as depicted in FIG. 8B. In one embodiment, graded blocking dielectric layer 824 is formed from at least two different materials. In a specific embodiment, forming graded blocking dielectric layer 824 from at least two different materials includes oxidizing a top portion of charge-trapping layer 822 and, subsequently, depositing a dielectric layer above the oxidized portion of charge-trapping layer 824. In another specific embodiment, forming graded blocking dielectric layer 824 from at least two different materials includes depositing a first dielectric layer having a first dielectric constant and, subsequently, depositing a second dielectric layer having a second dielectric constant, wherein the second dielectric constant is greater than the first dielectric constant.

Referring to FIG. 8C, process operations similar to those described in association with FIGS. 7E-7I are carried out to form a nonvolatile charge trap memory device having a graded blocking dielectric layer. Thus, a patterned gate stack 804 is formed over a substrate 802. Source and drain regions 810 are formed on either side of patterned gate stack 804, defining a channel region 812. Patterned gate stack 804 includes a patterned tunnel dielectric layer 804A, a patterned charge-trapping layer 704B, a patterned graded blocking dielectric layer 804C and a patterned gate layer 804D.

Figure 9:
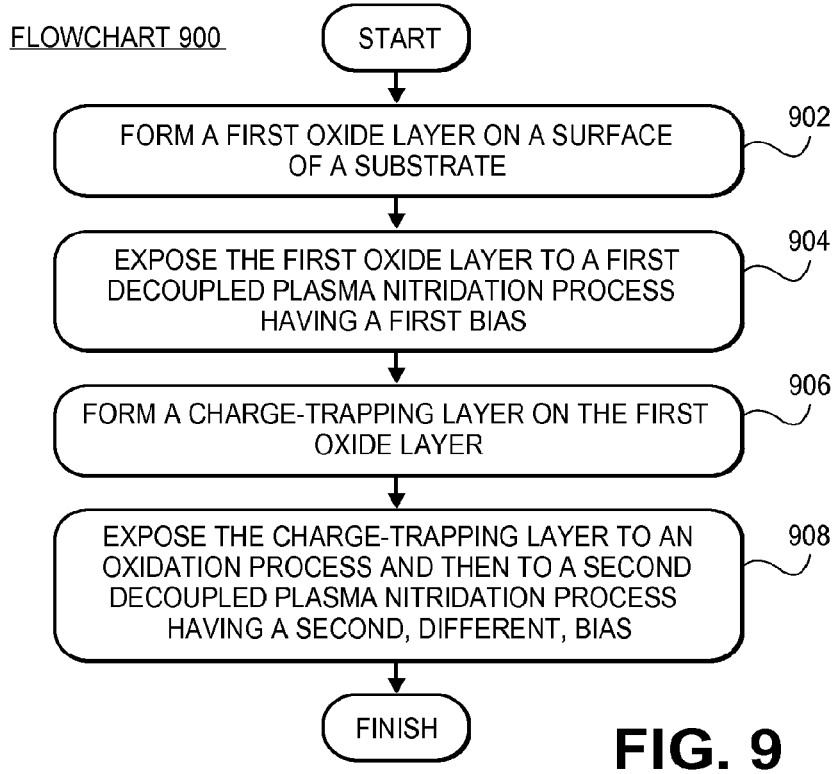
FIG. 9 illustrates a flowchart representing operations in a method for fabricating a nonvolatile charge trap memory device, in accordance with an embodiment of the present invention.

Decoupled plasma nitridation processes may be used in the fabrication of both a tunnel dielectric layer and a blocking dielectric layer. FIG. 9 illustrates a Flowchart 900 representing operations in a method for fabricating a nonvolatile charge trap memory device, in accordance with an embodiment of the present invention.

Referring to operation 902 of Flowchart 900, a method for fabricating a nonvolatile charge trap memory device includes forming a first oxide layer on a surface of a substrate. In an embodiment, forming the first oxide layer on the surface of the substrate includes thermally growing a layer of silicon dioxide on a silicon substrate.

Referring to operation 904 of Flowchart 900, the first oxide layer is exposed to a first decoupled plasma nitridation process having a first bias. In an embodiment, the first bias is approximately in the range of −100-+200 Volts and is sufficient to etch a portion of the first oxide layer. In one embodiment, exposing the first oxide layer to the first decoupled plasma nitridation process having the first bias includes etching a portion of the first oxide layer while implanting nitrogen into the remainder of the first oxide layer. In an embodiment, thermally growing the layer of silicon dioxide includes growing the layer to have a thickness approximately in the range of 5-6 nanometers, and etching the portion of the first oxide layer includes removing an amount of the first oxide layer approximately in the range of 3-4 nanometers.

Referring to operation 906 of Flowchart 900, subsequently, a charge-trapping layer is formed on the first oxide layer. In an embodiment, forming the charge-trapping layer on the first oxide layer includes depositing a silicon-rich silicon oxy-nitride layer. In one embodiment, depositing the silicon-rich silicon oxy-nitride layer includes depositing to a thickness of approximately 10 nanometers.

Referring to operation 908 of Flowchart 900, the charge-trapping layer is exposed to an oxidation process and then to a second decoupled plasma nitridation process having a second, different, bias. In an embodiment, the second bias is approximately in the range of −100-+100 Volts and is insufficient to etch a portion of the charge-trapping layer. In one embodiment, exposing the charge-trapping layer to the oxidation process includes converting a top portion of the charge-trapping layer to a second oxide layer by a steam oxidation process, and exposing the charge-trapping layer to the second decoupled plasma nitridation process having the second bias includes converting a top portion of the second oxide layer to a silicon nitride layer. In an embodiment, converting the top portion of the charge-trapping layer to a second oxide layer includes converting approximately 6 nanometers of the charge-trapping layer, and converting the top portion of the second oxide layer to the silicon nitride layer includes converting approximately 4 nanometers of the second oxide layer.

Figure 10:
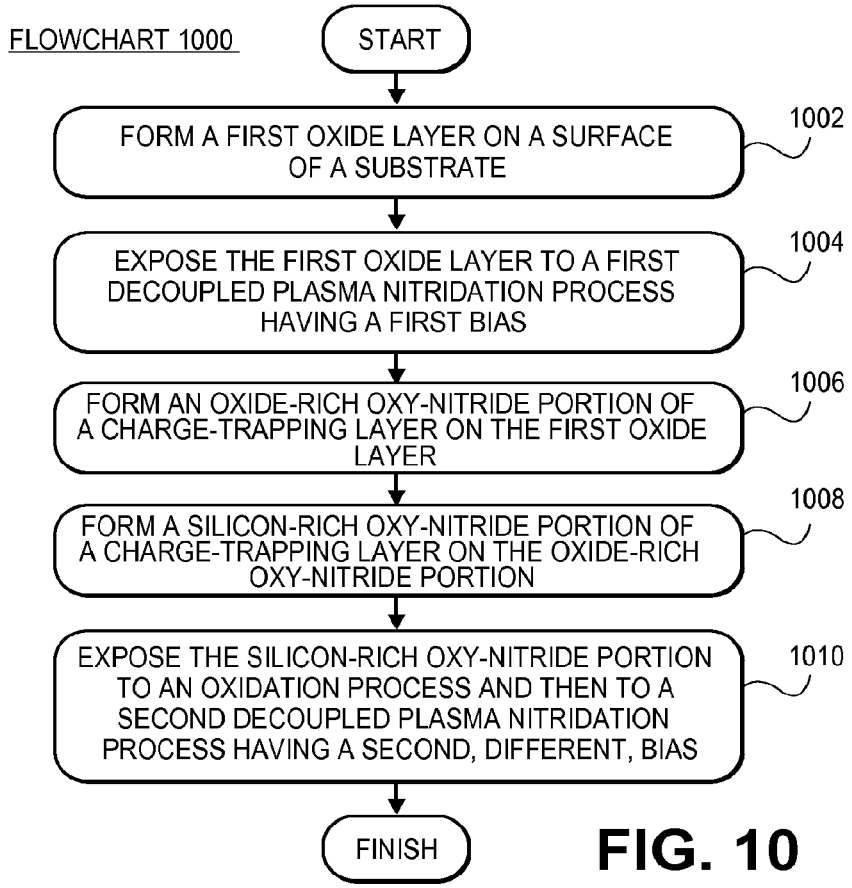
FIG. 10 illustrates a flowchart representing operations in a method for fabricating a nonvolatile charge trap memory device, in accordance with an embodiment of the present invention.

Decoupled plasma nitridation processes may be used in the fabrication of both a tunnel dielectric layer and a blocking dielectric layer in a SONOS-type stack that includes a multi-layer charge-trapping layer. FIG. 10 illustrates a Flowchart 1000 representing operations in a method for fabricating a nonvolatile charge trap memory device, in accordance with an embodiment of the present invention.

Referring to operation 1002 of Flowchart 1000, a method for fabricating a nonvolatile charge trap memory device includes forming a first oxide layer on a surface of a substrate. In an embodiment, forming the first oxide layer on the surface of the substrate includes thermally growing a layer of silicon dioxide on a silicon substrate.

Referring to operation 1004 of Flowchart 1000, the first oxide layer is exposed to a first decoupled plasma nitridation process having a first bias. In an embodiment, the first bias is approximately in the range of −100-+200 Volts and is sufficient to etch a portion of the first oxide layer. In one embodiment, exposing the first oxide layer to the first decoupled plasma nitridation process having the first bias includes etching a portion of the first oxide layer while implanting nitrogen into the remainder of the first oxide layer. In an embodiment, thermally growing the layer of silicon dioxide includes growing the layer to have a thickness approximately in the range of 4-5 nanometers, and etching the portion of the first oxide layer comprises removing an amount of the first oxide layer approximately in the range of 2-3 nanometers.

Referring to operation 1006 of Flowchart 1000, subsequently, an oxide-rich oxy-nitride portion of a charge-trapping layer is formed on the first oxide layer. Referring to operation 1008 of Flowchart 1000, a silicon-rich oxy-nitride portion of a charge-trapping layer is formed on the oxide-rich oxy-nitride portion. In an embodiment, depositing the silicon-rich oxy-nitride portion includes depositing to a thickness of approximately 10 nanometers.

Referring to operation 1010 of Flowchart 1000, the silicon-rich oxy-nitride portion is exposed to an oxidation process and then to a second decoupled plasma nitridation process having a second, different, bias. In an embodiment, the second bias is approximately in the range of −100-+100 Volts and is insufficient to etch a portion of the silicon-rich oxy-nitride portion of the charge-trapping layer. In one embodiment, exposing the silicon-rich oxy-nitride portion to the oxidation process includes converting a top portion of the silicon-rich oxy-nitride portion to a second oxide layer by a steam oxidation process, and exposing the silicon-rich oxy-nitride portion to the second decoupled plasma nitridation process having the second bias includes converting a top portion of the second oxide layer to a silicon nitride layer. In an embodiment, converting the top portion of the silicon-rich oxy-nitride portion to a second oxide layer includes converting approximately 6 nanometers of the silicon-rich oxy-nitride portion, and converting the top portion of the second oxide layer to the silicon nitride layer includes converting approximately 4 nanometers of the second oxide layer.

Figure 11:
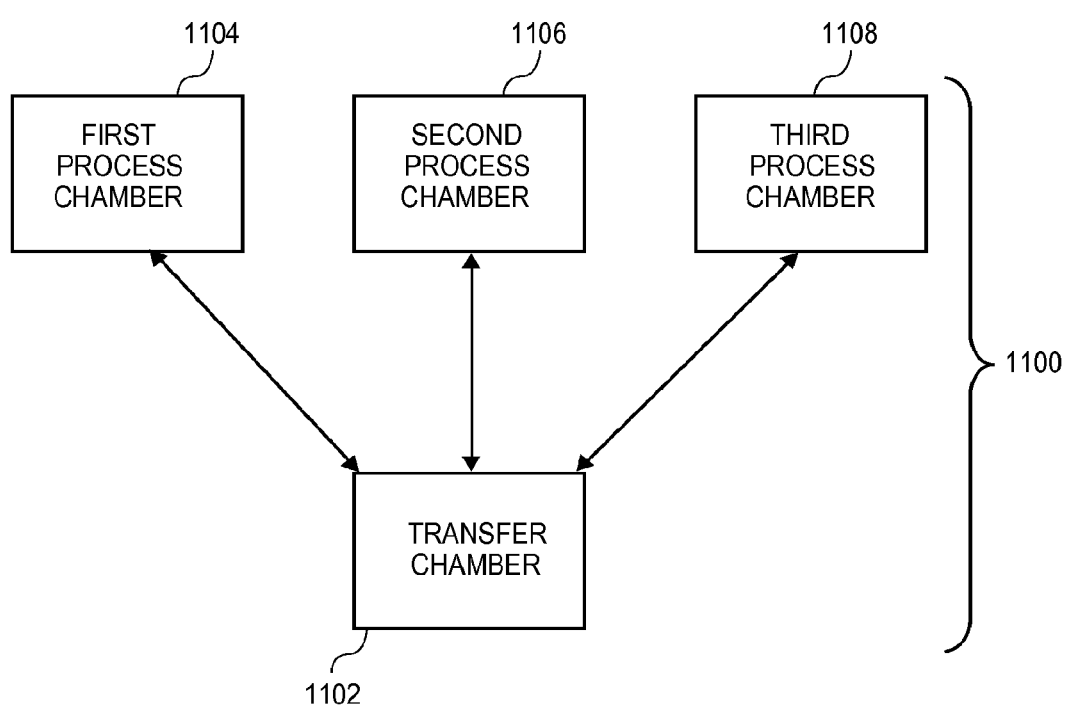
FIG. 11 illustrates a schematic for a cluster toot, in accordance with an embodiment of the present invention.

A portion of a nonvolatile charge trap memory device may be fabricated in a single-wafer cluster tool. FIG. 11 illustrates an arrangement of process chambers in a single-wafer cluster tool, in accordance with an embodiment of the present invention. Referring to FIG. 11, an arrangement of process chambers in a single-wafer cluster tool 1100 includes a transfer chamber 1102, a first process chamber 1104, a second process chamber 1106 and a third process chamber 1108. In an embodiment, transfer chamber 1102 is for receiving a wafer from an external environment for introduction into single-wafer cluster tool 1100. In one embodiment, each of the process chambers 1102, 1104 and 1106 are arranged in a way such that a wafer may be passed back- and forth between these chambers and transfer chamber 1102, as depicted by the double-headed arrows in FIG. 11. In accordance with an additional embodiment of the present invention, although not shown, single-wafer cluster tool 1100 may be configured such that a wafer can be transferred directly between process chambers 1102, 1104 and 1106.

Single-wafer cluster tool 1100 may be any cluster tool where an outside environment is excluded in and between process chambers 1104, 1106 and 1108 and transfer chamber 1102. Thus, in accordance with an embodiment of the present invention, once a wafer has entered process chamber 1102, it is protected from an external environment as it is moved into and between process chambers 1104, 1106 and 1108 and transfer chamber 1102. An example of such a single-wafer cluster tool is the Centura® platform commercially available from Applied Materials, Inc., located in Santa Clara, Calif. In one embodiment, once a wafer has been received by transfer chamber 1102, a vacuum of less than approximately 100 mTorr is maintained in single-wafer cluster tool 1100.

Process chambers 1102, 1104 and 1106 may include, but are not limited to, single-wafer oxidation chambers, single-wafer low-pressure chemical vapor deposition chambers, or a combination thereof. For example, in accordance with an embodiment of the present invention, first process chamber 1104 is a single-wafer oxidation chamber, second process chamber 1106 is a single-wafer low-pressure chemical vapor deposition chamber, and third process chamber 1108 is a single-wafer low-pressure chemical vapor deposition chamber. An example of a single-wafer oxidation chamber is the In-Situ Steam Generation (ISSG) chamber from Applied Materials, Inc. Examples of single-wafer low-pressure chemical vapor deposition chambers include a SiNgen™ chamber and an OXYgen™ chamber from Applied Materials, Inc. Instead of heating entire process chambers to heat a wafer, which is the case for typical batch process chambers, a chuck used for carrying a single wafer may be heated to heat the wafer. In accordance with an embodiment of the present invention, a chuck is used to heat a wafer to the appropriate process temperature. Thus, relatively short temperature ramp times and stabilization times may be achieved.

Figure 12:
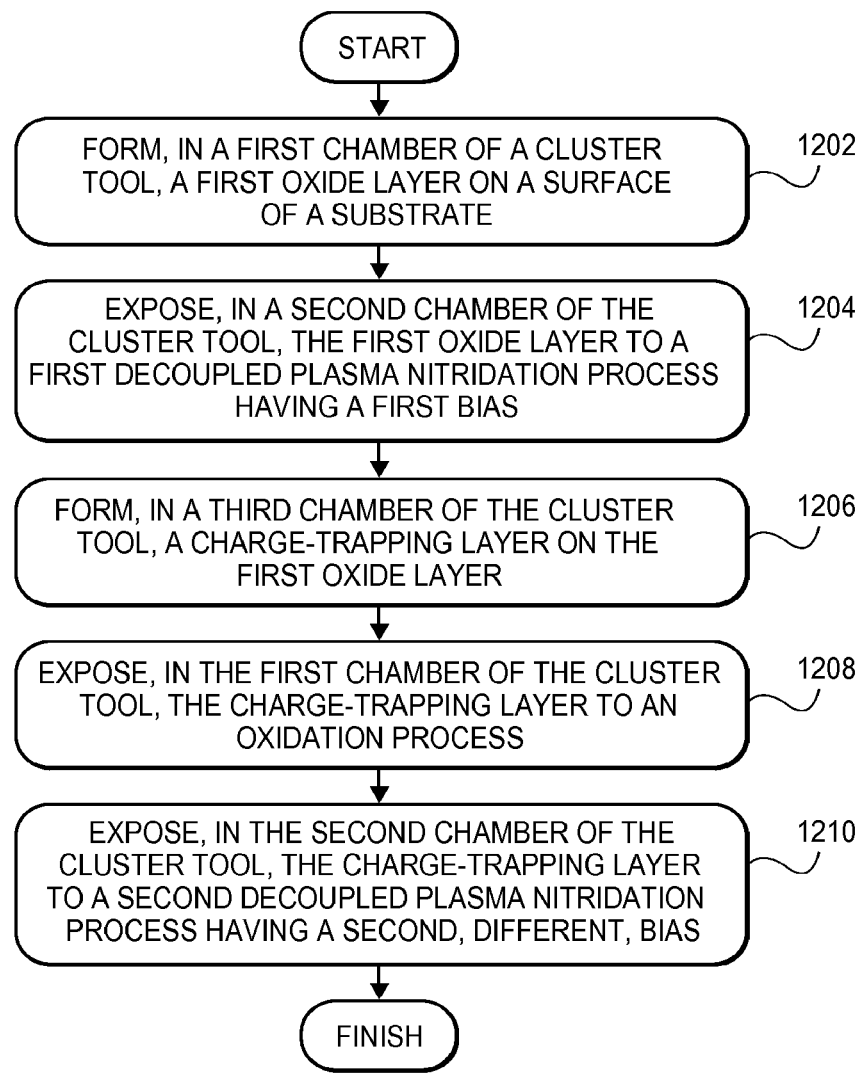
FIG. 12 illustrates a flowchart representing operations in a method for fabricating a nonvolatile charge trap memory device, in accordance with an embodiment of the present invention.

A portion of a nonvolatile charge trap memory device may be fabricated in a single-wafer cluster tool. FIG. 12 depicts a Flowchart 1200 representing a series of operations in a method for fabricating a nonvolatile charge trap memory device, in accordance with an embodiment of the present invention.

Referring to operation 1202 of Flowchart 1200, a method for fabricating a nonvolatile charge trap memory device includes forming, in a first chamber of a cluster tool, a first oxide layer on a surface of a substrate. In an embodiment, forming the first oxide layer on the surface of the substrate includes thermally growing a layer of silicon dioxide on a silicon substrate. In one embodiment, thermally growing the layer of silicon dioxide includes growing the layer to have a thickness approximately in the range of 4-6 nanometers.

Referring to operation 1204 of Flowchart 1200, in a second chamber of the cluster tool, the first oxide layer is exposed to a first decoupled plasma nitridation process having a first bias. In an embodiment, the first bias is approximately in the range of −100-+200 Volts and is sufficient to etch a portion of the first oxide layer. In one embodiment, exposing the first oxide layer to the first decoupled plasma nitridation process having the first bias includes etching a portion of the first oxide layer while implanting nitrogen into the remainder of the first oxide layer. In an embodiment, etching the portion of the first oxide layer includes removing an amount of the first oxide layer approximately in the range of 2-4 nanometers.

Referring to operation 1206 of Flowchart 1200, subsequently, in a third chamber of the cluster tool, a charge-trapping layer is formed on the first oxide layer. In an embodiment, forming the charge-trapping layer on the first oxide layer includes depositing at least a top silicon-rich silicon oxy-nitride layer. In one embodiment, depositing the silicon-rich silicon oxy-nitride layer includes depositing to a thickness of approximately 10 nanometers.

Referring to operation 1208 of Flowchart 1200, in the first chamber of the cluster tool, the charge-trapping layer is exposed to an oxidation process. In an embodiment, exposing the charge-trapping layer to the oxidation process includes converting a top portion of the charge-trapping layer to a second oxide layer by a steam oxidation process. In one embodiment, converting the top portion of the charge-trapping layer to a second oxide layer includes converting approximately 6 nanometers of the charge-trapping layer.

Referring to operation 1210 of Flowchart 1200, subsequently, in the second chamber of the cluster tool, the charge-trapping layer is exposed to a second decoupled plasma nitridation process having a second, different, bias. In an embodiment, the second bias is approximately in the range of −100-+100 Volts and is insufficient to etch a portion of the charge-trapping layer. In one embodiment, exposing the charge-trapping layer to the second decoupled plasma nitridation process having the second bias includes converting a top portion of the second oxide layer to a silicon nitride layer. In an embodiment, converting the top portion of the second oxide layer to the silicon nitride layer includes converting approximately 4 nanometers of the second oxide layer.

Figure 13:
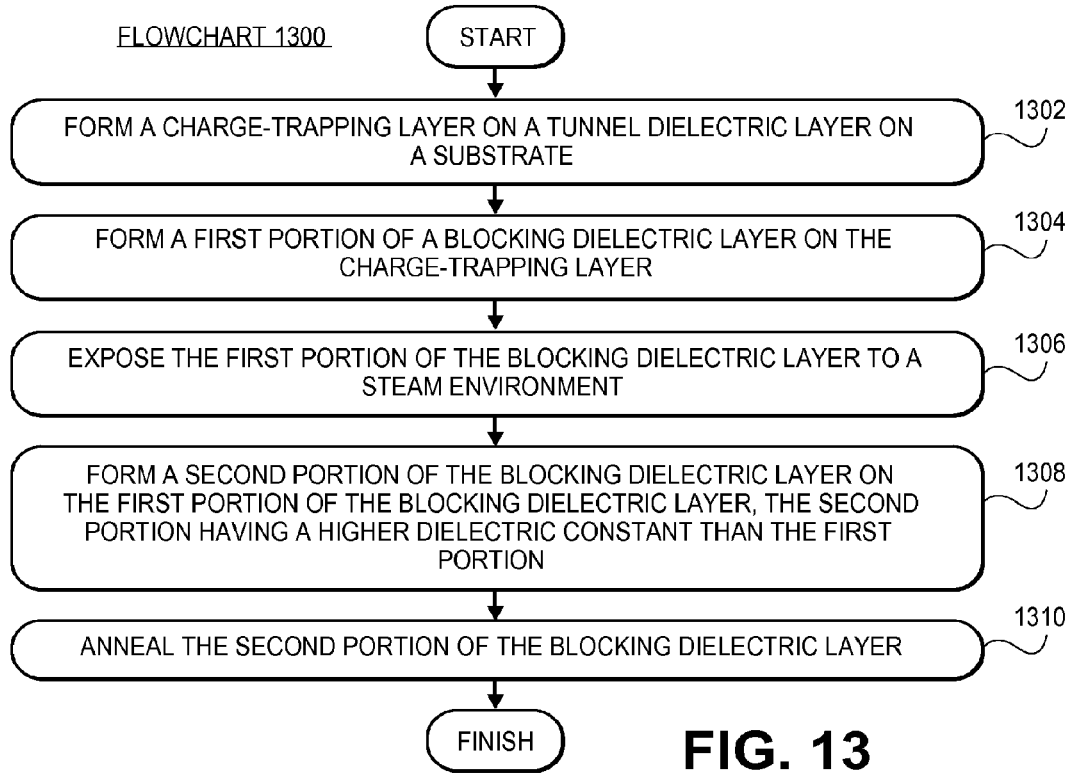
FIG. 13 illustrates a flowchart representing operations in a method for fabricating a nonvolatile charge trap memory device, in accordance with an embodiment of the present invention.

A higher dielectric, nitride portion of a blocking dielectric layer may deposited instead of converted first from another material. FIG. 13 illustrates a Flowchart 1300 representing operations in a method for fabricating a nonvolatile charge trap memory device, in accordance with an embodiment of the present invention.

Referring to operation 1302 of Flowchart 1300, a method for fabricating a nonvolatile charge trap memory device includes forming a charge-trapping layer on a tunnel dielectric layer on a substrate. Referring to operation 1304 of Flowchart 1300, a first portion of a blocking dielectric layer is formed on the charge-trapping layer. In an embodiment, forming the first portion of the blocking dielectric layer includes forming a silicon dioxide layer. In one embodiment, forming the silicon dioxide layer includes forming to a thickness approximately in the range of 1.5-2.5 nanometers.

Referring to operation 1306 of Flowchart 1300, the first portion of the blocking dielectric layer is exposed to a steam environment. In an embodiment, the steam environment is at a temperature approximately in the range of 800-900 degrees Celsius.

Referring to operation 1308 of Flowchart 1300, a second portion of the blocking dielectric layer is formed on the first portion of the blocking dielectric layer, the second portion having a higher dielectric constant than the first portion. In an embodiment, forming the second portion of the blocking dielectric layer includes forming a silicon nitride layer.

Referring to operation 1310 of Flowchart 1300, the second portion of the blocking dielectric layer is annealed. In an embodiment, annealing the second portion of the blocking dielectric layer includes heating in an atmosphere including nitrogen at a temperature approximately in the range of 900-1100 degrees Celsius for a duration approximately in the range of 30 seconds-60 seconds. In one embodiment, the atmosphere including nitrogen is composed of a gas such as, but not limited to, nitrogen (N$_2$), nitrous oxide (N$_2$O), nitrogen dioxide (NO$_2$), nitric oxide (NO) or ammonia (NH$_3$).

Figure 14:
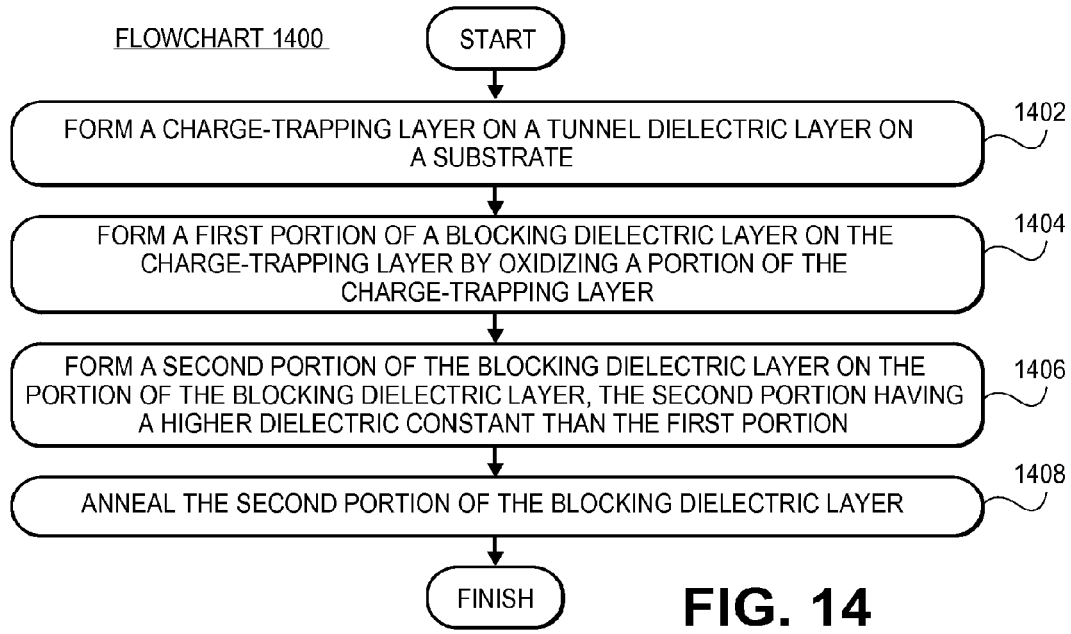
FIG. 14 illustrates a flowchart representing operations in a method for fabricating a nonvolatile charge trap memory device, in accordance with an embodiment of the present invention.

A portion of a charge-trapping layer may be used to fabricate a first portion of a blocking dielectric layer. FIG. 14 illustrates a Flowchart 1400 representing operations in a method for fabricating a nonvolatile charge trap memory device, in accordance with an embodiment of the present invention.

Referring to operation 1402 of Flowchart 1400, a method for fabricating a nonvolatile charge trap memory device includes forming a charge-trapping layer on a tunnel dielectric layer on a substrate.

Referring to operation 1404 of Flowchart 1400, a first portion of a blocking dielectric layer is formed on the charge-trapping layer by oxidizing a portion of the charge-trapping layer. In an embodiment, forming the first portion of the blocking dielectric layer includes forming a silicon dioxide layer. In one embodiment, forming the silicon dioxide layer includes forming to a thickness approximately in the range of 1.5-2.5 nanometers. In an embodiment, oxidizing the portion of the charge-trapping layer includes exposing the charge trapping layer to a radical oxidation process using oxygen (O$_2$) and hydrogen (H$_2$) gas at a temperature approximately in the range of 1000-1100 degrees Celsius.

Referring to operation 1406 of Flowchart 1400, a second portion of the blocking dielectric layer is formed on the first portion of the blocking dielectric layer, the second portion having a higher dielectric constant than the first portion. In an embodiment, forming the second portion of the blocking dielectric layer includes forming a silicon nitride layer.

Referring to operation 1408 of Flowchart 1400, the second portion of the blocking dielectric layer is annealed. In an embodiment, annealing the second portion of the blocking dielectric layer includes heating in an atmosphere including nitrogen at a temperature approximately in the range of 900-1100 degrees Celsius for a duration approximately in the range of 30 seconds-60 seconds. In one embodiment, the atmosphere including nitrogen is composed of a gas such as, but not limited to, nitrogen (N$_2$), nitrous oxide (N$_2$O), nitrogen dioxide (NO$_2$), nitric oxide (NO) or ammonia (NH$_3$).

Figure 15:
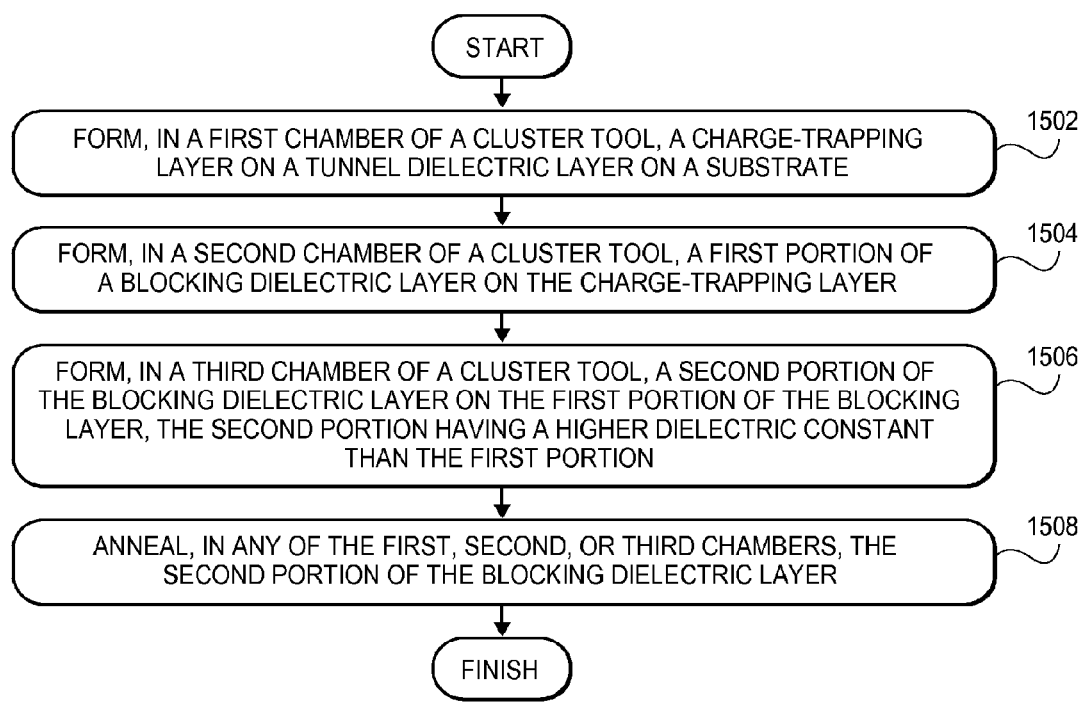
FIG. 15 illustrates a flowchart representing operations in a method for fabricating a nonvolatile charge trap memory device, in accordance with an embodiment of the present invention.

A multi-layer blocking dielectric layer may be fabricated in a cluster tool. FIG. 15 illustrates a Flowchart 1500 representing operations in a method for fabricating a nonvolatile charge trap memory device, in accordance with an embodiment of the present invention.

Referring to operation 1502 of Flowchart 1500, a method for fabricating a nonvolatile charge trap memory device includes forming, in a first chamber of a cluster tool, a charge-trapping layer on a tunnel dielectric layer on a substrate.

Referring to operation 1504 of Flowchart 1500, in a second chamber of a cluster tool, a first portion of a blocking dielectric layer is formed on the charge-trapping layer. In an embodiment, forming the first portion of the blocking dielectric layer includes forming a silicon dioxide layer. In one embodiment, forming the silicon dioxide layer includes forming to a thickness approximately in the range of 1.5-2.5 nanometers. In an embodiment, forming the first portion of the blocking dielectric layer on the charge-trapping layer includes oxidizing a portion of the charge-trapping layer by exposing the charge trapping layer to a radical oxidation process using oxygen (O$_2$) and hydrogen (H$_2$) gas at a temperature approximately in the range of 1000-1100 degrees Celsius.

Referring to operation 1506 of Flowchart 1500, in a third chamber of a cluster tool, a second portion of the blocking dielectric layer is formed on the first portion of the blocking dielectric layer, the second portion having a higher dielectric constant than the first portion. In an embodiment, forming the second portion of the blocking dielectric layer includes forming a silicon nitride layer. In one embodiment, prior to forming the second portion of the dielectric layer, the first portion of the blocking dielectric layer is exposed to a steam environment. In a specific embodiment, the steam environment is at a temperature approximately in the range of 800-900 degrees Celsius.

Referring to operation 1508 of Flowchart 1500, in any of the first, second, or third chambers, the second portion of the blocking dielectric layer is annealed. In an embodiment, annealing the second portion of the blocking dielectric layer includes heating in an atmosphere including nitrogen at a temperature approximately in the range of 900-1100 degrees Celsius for a duration approximately in the range of 30 seconds-60 seconds. In one embodiment, the atmosphere including nitrogen is composed of a gas such as, but not limited to, nitrogen (N$_2$), nitrous oxide (N$_2$O), nitrogen dioxide (NO$_2$), nitric oxide (NO) or ammonia (NH$_3$).

Figure 16:
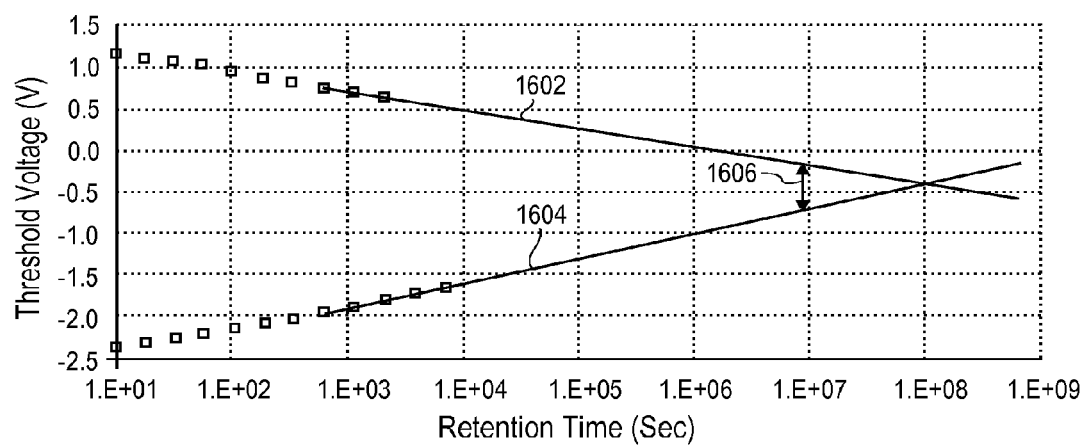
FIG. 16 is a plot of Threshold Voltage (V) as a function of Retention Time (Sec) for a nonvolatile charge trap memory device, in accordance with an embodiment of the present invention.
Figure 17:
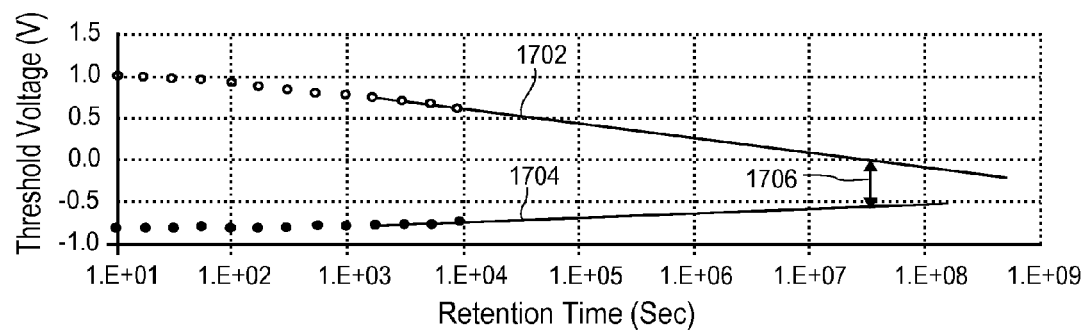
FIG. 17 is a plot of Threshold Voltage (V) as a function of Retention Time (Sec) for a nonvolatile charge trap memory device, in accordance with an embodiment of the present invention.

Some SONOS or SONOS-type transistors may exhibit poor data retention in the charge-trapping layer, limiting semiconductor device lifetime and its use in several applications due to leakage current through the layer. One attempt to address this situation has focused on the use of silicon-rich SONOS layers, which enable a large initial separation between program and erase voltages at the beginning of life but may result a rapid deterioration of charge storing ability. Another attempt focused on oxygen-rich layers, which enable a reduced rate of deterioration of charge storing ability, but also may reduce the initial separation between program and erase voltages. The effect of both of these approaches on data retention over time may be shown graphically. FIGS. 16 and 17 are plots of Threshold Voltage (V) as a function of Retention Time (Sec) for certain nonvolatile charge trap memory devices.

Referring to FIG. 16, rapid deterioration of charge storing ability for a silicon-rich layer is indicated by the convergence of the programming threshold voltage (VTP) 1602 and erase threshold voltage (VTE) 1604 to a specified minimum 1606.

Referring to FIG. 17, a reduced separation between VTP 1702 and VTE 1704 is obtained for an oxygen-rich layer. As indicated by line 1706, the overall useful lifetime of device may or may not be appreciably extended by this approach.

A nonvolatile charge trap memory device including a multi-layer charge-trapping region having a deuterated layer may exhibit increased programming and erase speed and data retention. In accordance with an embodiment of the present invention, a deuterated layer is formed between the charge-trapping layer of the multi-layer charge-trapping region and the tunnel dielectric layer. In one embodiment, the deuterated layer is basically trap-free and mitigates hot electron degradation during erase and program cycles. By incorporating a trap-free layer between the tunnel dielectric layer and the charge-trapping layer of a multi-layer charge-trapping region, the Vt shift from erase and program cycles may be reduced and the retention may be increased. In accordance with another embodiment of the present invention, a second deuterated layer is also formed between the charge-trapping layer of the multi-layer charge-trapping region and a top dielectric layer of the gate stack.

Figure 18:
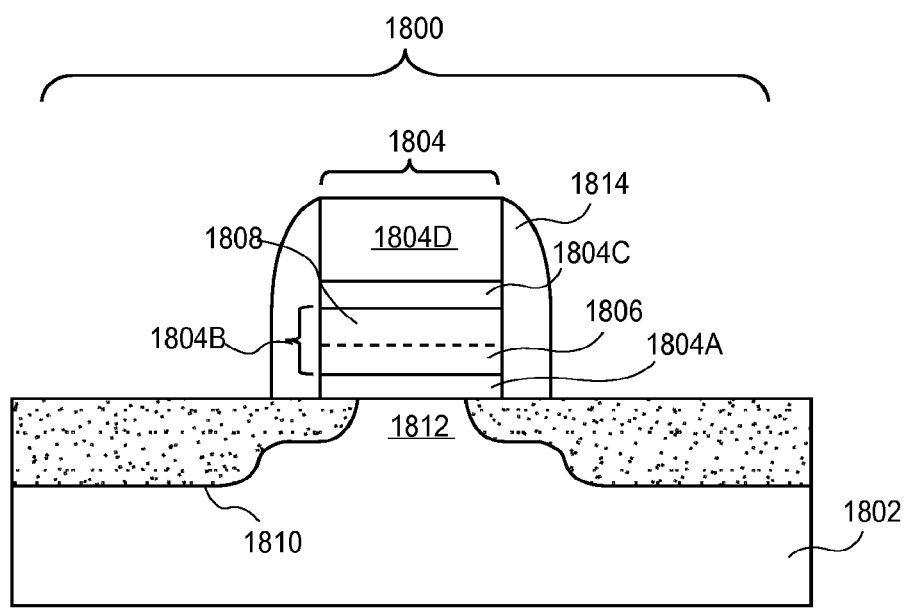
FIG. 18 illustrates a cross-sectional view of a nonvolatile charge trap memory device, in accordance with an embodiment of the present invention.

A nonvolatile charge trap memory device may include a multi-layer charge-trapping region having a deuterated layer. FIG. 18 illustrates a cross-sectional view of a non-volatile charge trap memory device, in accordance with an embodiment of the present invention.

Referring to FIG. 18, semiconductor device 1800 includes a gate stack 1804 formed over a substrate 1802. Semiconductor device 1800 further includes source and drain regions 1810 in substrate 1802 on either side of gate stack 1804, defining a channel region 1812 in substrate 1802 underneath gate stack 1804. Gate stack 1804 includes a tunnel dielectric layer 1804A, a multi-layer charge-trapping region 1804B, a top dielectric layer 1804C and a gate layer 1804D. Thus, gate layer 1804D is electrically isolated from substrate 1802. Multi-layer charge-trapping region 1804B includes a deuterated layer 1806 between a charge-trapping layer 1808 of multi-layer charge-trapping region 1804B and tunnel dielectric layer 1804A. A pair of dielectric spacers 1814 isolates the sidewalls of gate stack 1804.

Semiconductor device 1800 may be a nonvolatile charge trap memory device. In one embodiment, semiconductor device 1800 is a Flash-type device wherein the charge-trapping layer is a conductor layer or a semiconductor layer. In accordance with another embodiment of the present invention, semiconductor device 1800 is a SONOS-type device wherein the charge-trapping layer is an insulator layer. By convention, SONOS stands for "Semiconductor-Oxide-Nitride-Oxide-Semiconductor," where the first "Semiconductor" refers to the channel region material, the first "Oxide" refers to the tunnel dielectric layer, "Nitride" refers to the charge-trapping dielectric layer, the second "Oxide" refers to the top dielectric layer (also known as a blocking dielectric layer) and the second "Semiconductor" refers to the gate layer. A SONOS-type device, however, is not limited to these specific materials, as described below.

Substrate 1802 and, hence, channel region 1812, may be composed of a material suitable for semiconductor device fabrication. In one embodiment, substrate 1802 is a bulk substrate composed of a single crystal of a material which may include, but is not limited to, silicon, germanium, silicon-germanium or a III-V compound semiconductor material. In another embodiment, substrate 1802 includes a bulk layer with a top epitaxial layer. In a specific embodiment, the bulk layer is composed of a single crystal of a material which may include, but is not limited to, silicon, germanium, silicon-germanium, a III-V compound semiconductor material or quartz, while the top epitaxial layer is composed of a single crystal layer which may include, but is not limited to, silicon, germanium, silicon-germanium or a III-V compound semiconductor material. In another embodiment, substrate 1802 includes a top epitaxial layer on a middle insulator layer which is above a lower bulk layer. The top epitaxial layer is composed of a single crystal layer which may include, but is not limited to, silicon (i.e. to form a silicon-on-insulator (SOI) semiconductor substrate), germanium, silicon-germanium or a III-V compound semiconductor material. The insulator layer is composed of a material which may include, but is not limited to, silicon dioxide, silicon nitride or silicon oxy-nitride. The lower bulk layer is composed of a single crystal which may include, but is not limited to, silicon, germanium, silicon-germanium, a III-V compound semiconductor material or quartz. Substrate 1802 and, hence, channel region 1812, may include dopant impurity atoms. In a specific embodiment, channel region 1812 is doped P-type and, in an alternative embodiment, channel region 1812 is doped N-type.

Source and drain regions 1810 in substrate 1802 may be any regions having opposite conductivity to channel region 1812. For example, in accordance with an embodiment of the present invention, source and drain regions 1810 are N-type doped regions while channel region 1812 is a P-type doped region. In one embodiment, substrate 1802 and, hence, channel region 1812, is composed of boron-doped single-crystal silicon having a boron concentration in the range of $1 \times 10^{15}$-$1 \times 10^{19}$ atoms/cm$^3$. Source and drain regions 1810 are composed of phosphorous- or arsenic-doped regions having a concentration of N-type dopants in the range of $5 \times 10^{16}$-$5 \times 10^{19}$ atoms/cm$^3$. In a specific embodiment, source and drain regions 1810 have a depth in substrate 1802 in the range of 80-200 nanometers. In accordance with an alternative embodiment of the present invention, source and drain regions 1810 are P-type doped regions while channel region 1812 is an N-type doped region.

Tunnel dielectric layer 1804A may be a material and have a thickness suitable to allow charge carriers to tunnel into the charge-trapping layer under an applied gate bias while maintaining a suitable barrier to leakage when the device is unbiased. In one embodiment, tunnel dielectric layer 1804A is formed by a thermal oxidation process and is composed of silicon dioxide or silicon oxy-nitride, or a combination thereof. In another embodiment, tunnel dielectric layer 1804A is formed by chemical vapor deposition or atomic layer deposition and is composed of a dielectric layer which may include, but is not limited to, silicon nitride, hafnium oxide, zirconium oxide, hafnium silicate, hafnium oxy-nitride, hafnium zirconium oxide or lanthanum oxide. In a specific embodiment, tunnel dielectric layer 1804A has a thickness approximately in the range of 1-10 nanometers. In a particular embodiment, tunnel dielectric layer 1804A has a thickness of approximately 2 nanometers.

Multi-layer charge-trapping region 1804B may be composed of a material and have a thickness suitable to store charge and, hence, raise the threshold voltage of gate stack 1804. In one embodiment, multi-layer charge-trapping region 1804B is formed by a chemical vapor deposition process and is composed of a dielectric material which may include, but is not limited to, stoichiometric silicon nitride, silicon-rich silicon nitride or silicon oxy-nitride. In accordance with an embodiment of the present invention, multi-layer charge-trapping region 1804B includes a deuterated layer 1806 between tunnel dielectric layer 1804A and charge trapping layer 1808, as depicted in FIG. 18. Deuterated layer 1806 and charge-trapping layer 1808 may be composed of a deuterated derivative and a non-deuterated derivative, respectively, of the same material. For example, in accordance with an embodiment of the present invention, deuterated layer 1806 is a deuterated derivative of silicon oxy-nitride, while charge-trapping layer 1808 is formed from the hydrogenated derivative of silicon oxy-nitride. In one embodiment, the total thickness of multi-layer charge-trapping region 1804B is in the range of 5-10 nanometers. In a specific embodiment, the ratio of thicknesses of deuterated layer 1806:charge-trapping layer 1808 is approximately 1:1, respectively.

Multi-layer charge-trapping region 1804B may have an abrupt interface between deuterated layer 1806 and charge-trapping layer 1808. That is, in accordance with an embodiment of the present invention, charge-trapping layer 1808 is deuterium-free. Alternatively, a gradient of deuterium atom concentration moving from high concentration of deuterium in deuterated layer 1806 ranging to low concentration of deuterium in charge-trapping layer 1808 may be formed. Thus, in accordance with an alternative embodiment of the present invention, charge-trapping layer 1808 is a partially deuterated layer, but having a deuterium concentration less than that of deuterated layer 1806.

Top dielectric layer 1804C may be a material and have a thickness suitable to maintain a barrier to charge leakage without significantly decreasing the capacitance of gate stack 1804. In one embodiment, top dielectric layer 1804C is formed by a chemical vapor deposition process and is composed of silicon dioxide, silicon oxy-nitride, silicon nitride, or a combination thereof. In another embodiment, top dielectric layer 1804C is formed by atomic layer deposition and is composed of a high-k dielectric layer which may include, but is not limited to, hafnium oxide, zirconium oxide, hafnium silicate, hafnium oxy-nitride, hafnium zirconium oxide or lanthanum oxide. In a specific embodiment, top dielectric layer 1804C has a thickness in the range of 1-20 nanometers.

Gate layer 1804D may be composed of a conductor or semiconductor material suitable for accommodating a bias during operation of a SONOS-type transistor. In accordance with an embodiment of the present invention, gate layer 1804D is formed by a chemical vapor deposition process and is composed of doped poly-crystalline silicon. In another embodiment, gate layer 1804D is formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt or nickel.

Figure 19:
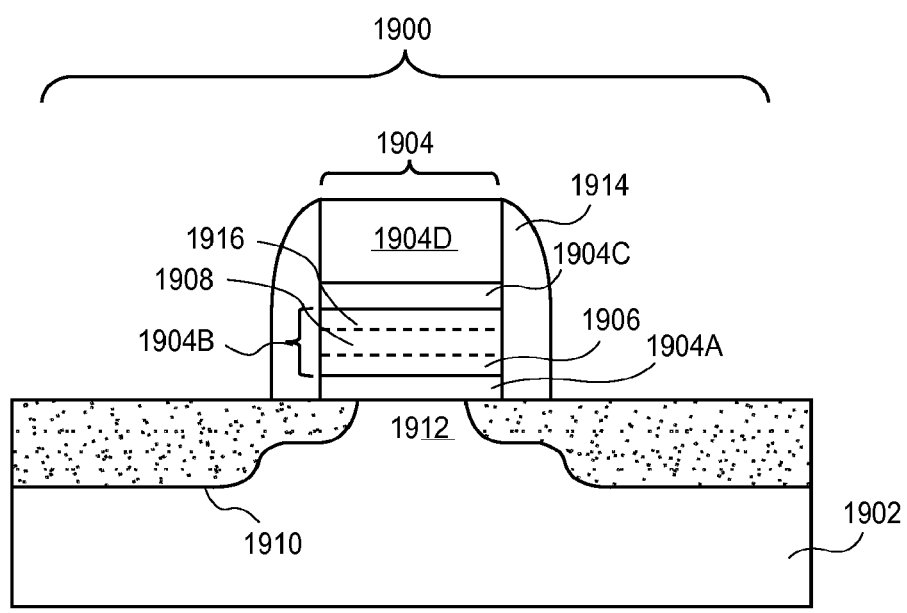
FIG. 19 illustrates a cross-sectional view of nonvolatile charge trap memory device, in accordance with an embodiment of the present invention.

A nonvolatile charge trap memory device may include a multi-layer charge-trapping region having more than one deuterated layer. FIG. 19 illustrates a cross-sectional view of a nonvolatile charge trap memory device, in accordance with an embodiment of the present invention.

Referring to FIG. 19, semiconductor device 1900 includes a gate stack 1904 formed over a substrate 1902. Semiconductor device 1900 further includes source and drain regions 1910 in substrate 1902 on either side of gate stack 1904, defining a channel region 1912 in substrate 1902 underneath gate stack 1904. Gate stack 1904 includes a tunnel dielectric layer 1904A, a multi-layer charge-trapping region 1904B, a top dielectric layer 1904C and a gate layer 1904D. Thus, gate layer 1904D is electrically isolated from substrate 1902. Multi-layer charge-trapping region 1904B includes a first deuterated layer 1906 and a second deuterated layer 1916 sandwiching charge-trapping layer 1908 of multi-layer charge-trapping region 1904B. A pair of dielectric spacers 1914 isolates the sidewalls of gate stack 1904.

Semiconductor device 1900 may be any semiconductor device described in association with semiconductor device 1800 from FIG. 18. Substrate 1902, source and drain regions 1910 and channel region 1912 may be composed of any material and dopant impurity atoms described in association with substrate 1802, source and drain regions 1810 and channel region 1812, respectively, from FIG. 18. Tunnel dielectric layer 1904A, top dielectric layer 1904C and gate layer 19041) may be composed of any material described in association with tunnel dielectric layer 1804A, top dielectric layer 1804C and gate layer 1804D, respectively, from FIG. 18.

However, in contrast to semiconductor device 1800, semiconductor device includes a multi-layer charge-trapping region 1904B having second deuterated layer 1916 above charge trapping layer 1908, as depicted in FIG. 19. First deuterated layer 1906 and charge-trapping layer 1908 may be composed of any material described in association with deuterated layer 1806 and charge-trapping layer 1808, respectively, from FIG. 18. Additionally, second deuterated layer 1916 may also be composed of any material described in association with deuterated layer 1806 from FIG. 18.

However, in accordance with an embodiment of the present invention, the total thickness of multi-layer charge-trapping region 1904B is in the range of 5-10 nanometers, i.e. multi-layer charge-trapping region 1904B has a thickness in the same range as multi-layer charge-trapping region 1804B from FIG. 18. Thus, the relative ratios of thicknesses of deuterated layers and the charge-trapping layer may differ from those of semiconductor device 1800. For example, in one embodiment, the ratio of thicknesses of first deuterated layer 1906:charge-trapping layer 1908:second deuterated layer 1916 is approximately 1:2:1, respectively.

As with multi-layer charge-trapping region 1804B from FIG. 18, multi-layer charge-trapping region 1904B may have an abrupt interface between first deuterated layer 1906 and charge-trapping layer 1908. Likewise, as second abrupt interface may exist between second deuterated layer 1916 and charge-trapping layer 1908. That is, in accordance with an embodiment of the present invention, charge-trapping layer 1908 is deuterium-free. Alternatively, a gradient of deuterium atom concentration moving from high concentration of deuterium in first and second deuterated layers 1906 and 1916 ranging to low concentration of deuterium in charge-trapping layer 1908 may be formed. Thus, in accordance with an alternative embodiment of the present invention, charge-trapping layer 1908 is a partially deuterated layer, but having a deuterium concentration less than that of deuterated layers 1906 and 1916.

A nonvolatile charge trap memory device may be fabricated to include a multi-layer charge-trapping region having a deuterated layer. FIGS. 20A-20I illustrate cross-sectional views representing operations in the formation of a nonvolatile charge trap memory device, in accordance with an embodiment of the present invention.

Figure 20A:
FIG. 20A illustrates a cross-sectional view representing an operation in the formation of a nonvolatile charge trap memory device, in accordance with an embodiment of the present invention.

Referring to FIG. 20A, a substrate 2002 is provided. Substrate 2002 may be composed of any material and have any characteristics described in association with substrates 1802 and 1902 from FIGS. 18 and 19, respectively.

Figure 20B:
FIG. 20B illustrates a cross-sectional view representing an operation in the formation of a nonvolatile charge trap memory device, in accordance with an embodiment of the present invention.

Referring to FIG. 20B, a tunnel dielectric layer 2020 is formed on the top surface of substrate 2002. Tunnel dielectric layer 2020 may be formed from any material, from any process, and have any thickness described in association with tunnel dielectric layers 1804A and 1904A from FIGS. 18 and 19, respectively.

Figure 20C:
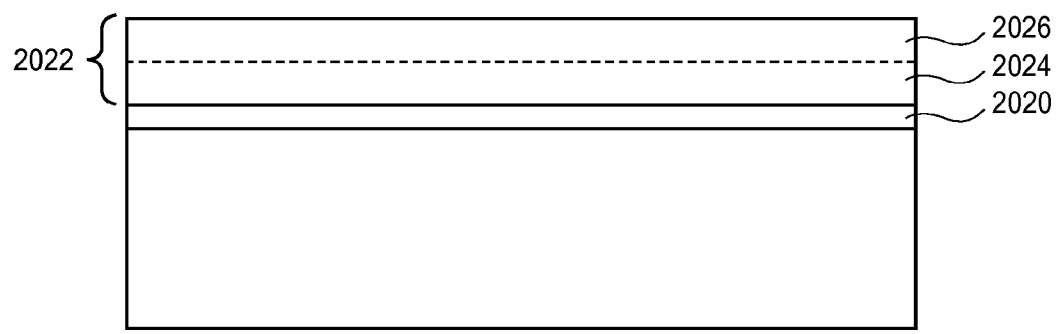
FIG. 20C illustrates a cross-sectional view representing an operation in the formation of a nonvolatile charge trap memory device, in accordance with an embodiment of the present invention.

Referring to FIG. 20C, a multi-layer charge-trapping region 2022 is formed on the top surface of tunnel dielectric layer 2020. In accordance with an embodiment of the present invention, multi-layer charge-trapping region 2022 includes a deuterated layer 2024 between tunnel dielectric layer 2020 and a charge-trapping layer 2026, as depicted in FIG. 20C. Deuterated layer 2024 and charge-trapping layer 2026 may be composed of any materials and have any thicknesses described in association with deuterated layer 1806 and charge-trapping layer 1808, respectively, from FIG. 18. Multi-layer charge-trapping region 2022 and, hence, deuterated layer 2024 and charge-trapping layer 2026 may be formed by any process suitable to provide substantially uniform coverage above tunnel dielectric layer 2020. In accordance with an embodiment of the present invention, multi-layer charge-trapping region 2022 is formed by a chemical vapor deposition process. In one embodiment, deuterated layer 2024 is formed first using deuterated formation gases and, subsequently, charge-trapping layer 2026 is formed next using non-deuterated formation gases. In a specific embodiment, multi-layer charge-trapping region 2022 is composed substantially of silicon oxy-nitride, wherein deuterated layer 2024 is first formed using formation gases such as, but not limited to, deuterated silane ($SiD_4$), deuterated dichlorosilane ($SiD_2Cl_2$), nitrous oxide ($N_2O$), deuterated ammonia ($ND_3$) and oxygen ($O_2$). Charge-trapping layer 2026 is then formed using formation gases such as, but not limited to, non-deuterated-bis(tert-butylamino)silane (non-deuterated-BTBAS), silane ($SiH_4$), dichlorosilane ($SiH_2Cl_2$), $N_2O$, ammonia ($NH_3$) and $O_2$. In a particular embodiment, deuterated layer 2024 and charge-trapping layer 2026 are formed in the same process operation, i.e. they are formed in the same process chamber with a seamless transition from deuterated formation gases to non-deuterated formation gases.

An abrupt deuterated and non-deuterated junction may be present at the interface of deuterated layer 2024 and charge-trapping layer 2026. Thus, in accordance with an embodiment of the present invention, charge-trapping layer 2026 remains deuterium-free. Alternatively, some of the deuterium present in deuterated layer 2024 may migrate to charge-trapping layer 2026 during the deposition of charge-trapping layer 2026 or during subsequent high temperature process operations. That is, a gradient of deuterium atom concentration moving from high concentration of deuterium in deuterated layer 2024 ranging to low concentration of deuterium in charge-trapping layer 2026 may be formed. Thus, in accordance with an alternative embodiment of the present invention, charge-trapping layer 2026 becomes a partially deuterated layer, but having a deuterium concentration less than that of deuterated layer 2024. In a specific embodiment, deuterated formation gases are employed to form a partially deuterated charge-trapping layer 626 having a deuterium concentration less than that of deuterated layer 2024.

Figure 20D:
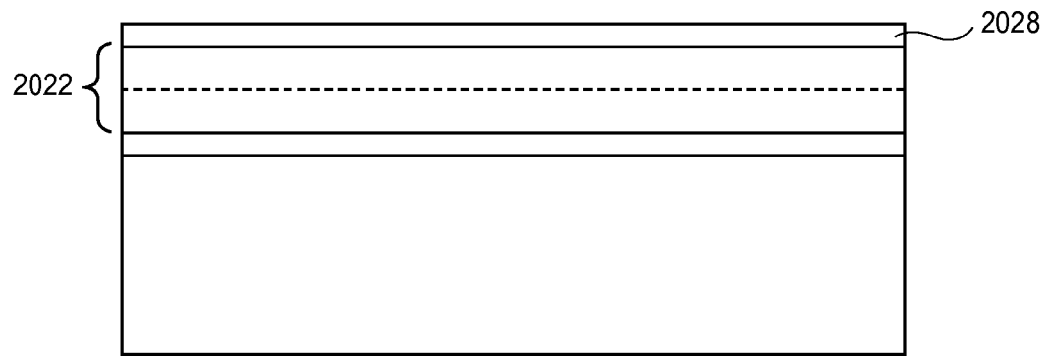
FIG. 20D illustrates a cross-sectional view representing an operation in the formation of a nonvolatile charge trap memory device, in accordance with an embodiment of the present invention.

Referring to FIG. 20D, a top dielectric layer 2028 is formed on the top surface of multi-layer charge-trapping region 2022. Top dielectric layer 2028 may be formed from arty material, from any process, and have any thickness described in association with top dielectric layers 1804C and 1904C from FIGS. 18 and 19, respectively. In accordance with an alternative embodiment of the present invention, top dielectric layer 2028 is formed by using deuterated formation gases. In such an embodiment, deuterated top dielectric layer 2028 subsequently acts as a source of deuterium to form a trap-free layer in multi-layer charge-trapping region 2022 during a subsequent anneal process. In a specific alternative embodiment, deuterated top dielectric layer 2028 is formed using formation gases such as, but not limited to, $SiD_4$, $SiD_2Cl_2$ and $N_2O$.

Figure 20E:
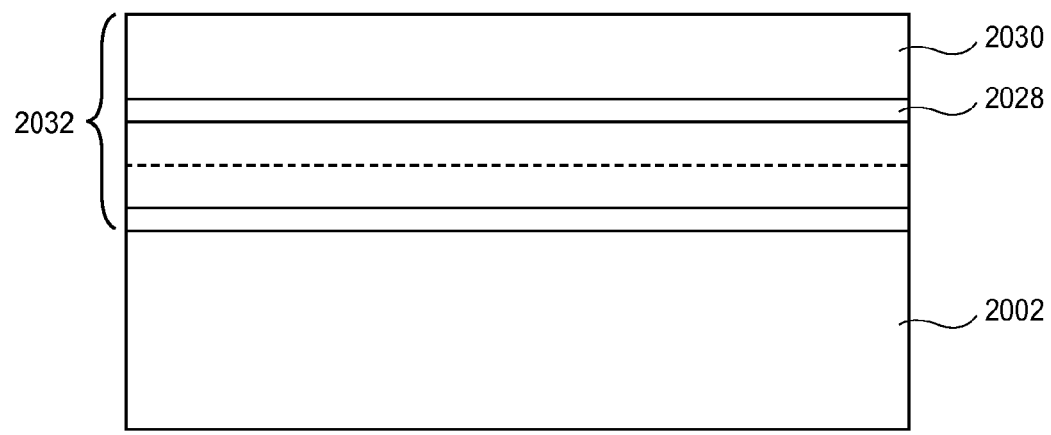
FIG. 20E illustrates a cross-sectional view representing an operation the formation of a nonvolatile charge trap memory device, in accordance with an embodiment of the present invention.

Referring to FIG. 20E, a gate layer 2030 is formed on the top surface of top dielectric layer 2028. Gate layer 2030 may be formed from any material and from any process described in association with gate layers 1804D and 1904D from FIGS. 18 and 19, respectively. Thus, a gate stack 2032 may be formed above substrate 2002.

Figure 20F:
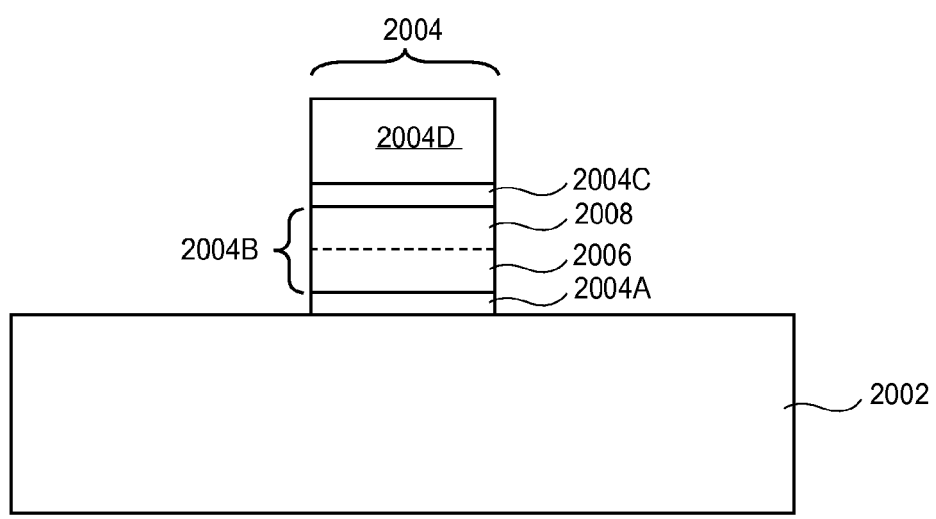
FIG. 20F illustrates a cross-sectional view representing an operation in the formation of a nonvolatile charge trap memory device, in accordance with an embodiment of the present invention.

Referring to FIG. 20F, gate stack 2032 is patterned to form a patterned gate stack 2004 above substrate 2002. Patterned gate stack 2004 includes a patterned tunnel dielectric layer 2004A, a patterned multi-layer charge-trapping region 2004B, a patterned top dielectric layer 2004C, and a patterned gate layer 2004D. Patterned multi-layer charge-trapping region 2004B includes a patterned deuterated layer 2006 and a patterned charge-trapping layer 2008. Gate stack 2032 may be patterned to form patterned gate stack 2004 by any process suitable to provide substantially vertical sidewalls for gate stack 2004 with high selectivity to substrate 2002. In accordance with an embodiment of the present invention, gate stack 2032 is patterned to form patterned gate stack 2004 by a lithography and etch process. In a specific embodiment, the etch process is an anisotropic etch process utilizing gases such as, but not limited to, carbon tetrafluoride ($CF_4$), $O_2$, hydrogen bromide (HBr) or chlorine ($Cl_2$).

Figure 20G:
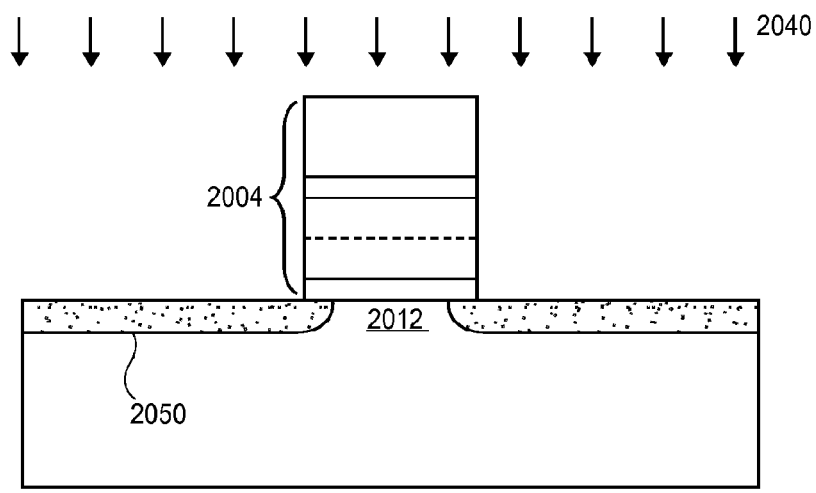
FIG. 20G illustrates a cross-sectional view representing an operation in the formation of a nonvolatile charge trap memory device, in accordance with an embodiment of the present invention.

Referring to FIG. 20G, it may be appropriate to implant dopant impurity atoms 2040 into the exposed portions of substrate 2004 to form source and drain tip extension regions 2050. Source and drain tip extension regions 2050 will ultimately become part of source and drain regions subsequently formed, as described below. Thus, by forming source and drain tip extension regions 2050 as defined by the location of patterned gate stack 2004, channel region 2012 may be defined, as depicted in FIG. 20G. In one embodiment, the conductivity type and the concentration of dopant impurity atoms used to form source and drain tip extension regions 2050 are substantially the same as those used to form source and drain regions, described below.

Figure 20H:
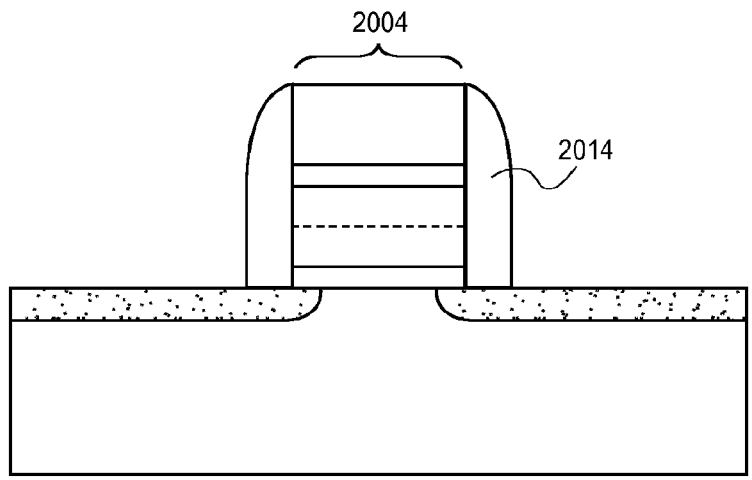
FIG. 20H illustrates a cross-sectional view representing an operation in the formation of a nonvolatile charge trap memory device, in accordance with an embodiment of the present invention.
Figure 20I:
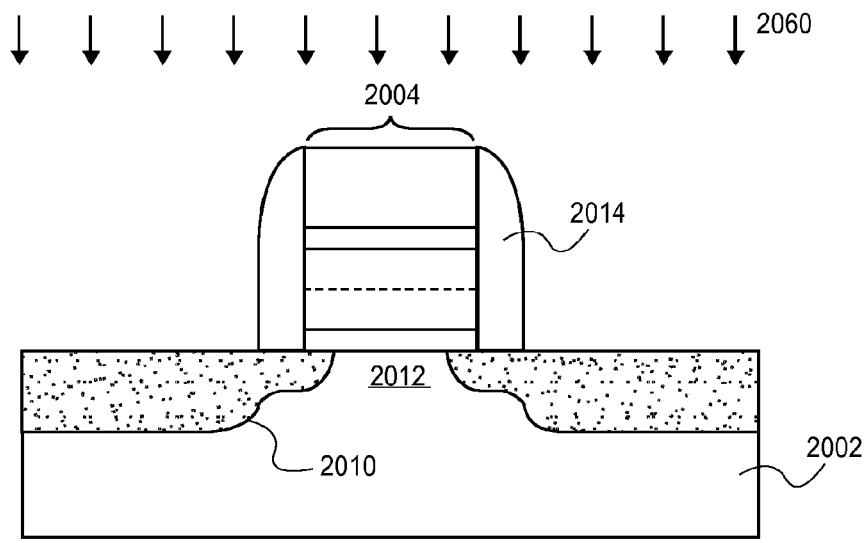
FIG. 20I illustrates a cross-sectional view representing an operation in the formation of a nonvolatile charge trap memory device, in accordance with an embodiment of the present invention.

Referring to FIG. 20H, it may be appropriate to form a pair of dielectric spacers 2014 on the sidewalls of patterned gate stack 2004. Finally, referring to FIG. 20I, source and drain regions 2010 are formed by implanting dopant impurity atoms 2060 into the exposed portions of substrate 2004. Source and drain regions 2010 may have any characteristics as those described in association with source and drain regions 1810 and 1910 from FIGS. 18 and 19, respectively. In accordance with an embodiment of the present invention, the profile of source and drain regions 2010 is defined by dielectric spacers 2014, patterned gate stack 2004 and source and drain tip extension regions 2050, as depicted in FIG. 20I.

Figure 21A:
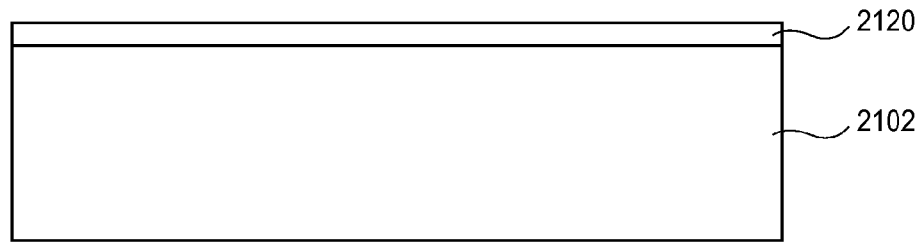
FIG. 21A illustrates a cross-sectional view representing an operation in the formation of a nonvolatile charge trap memory device, in accordance with an embodiment of the present invention.
Figure 21B:
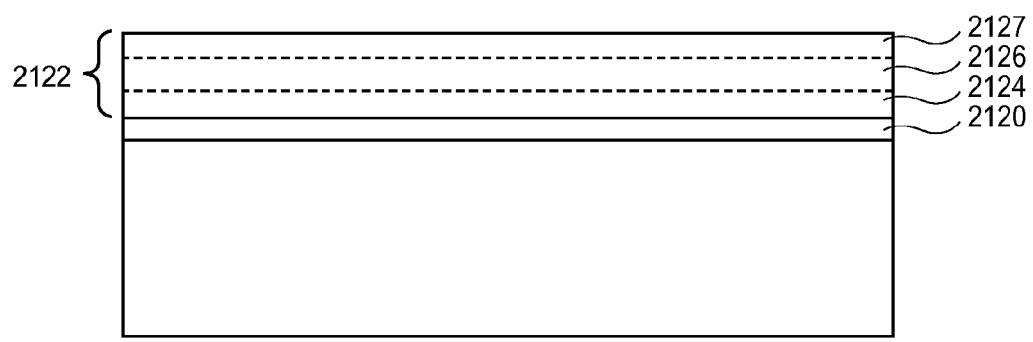
FIG. 21B illustrates a cross-sectional view representing an operation in the formation of a nonvolatile charge trap memory device, in accordance with an embodiment of the present invention.
Figure 21C:
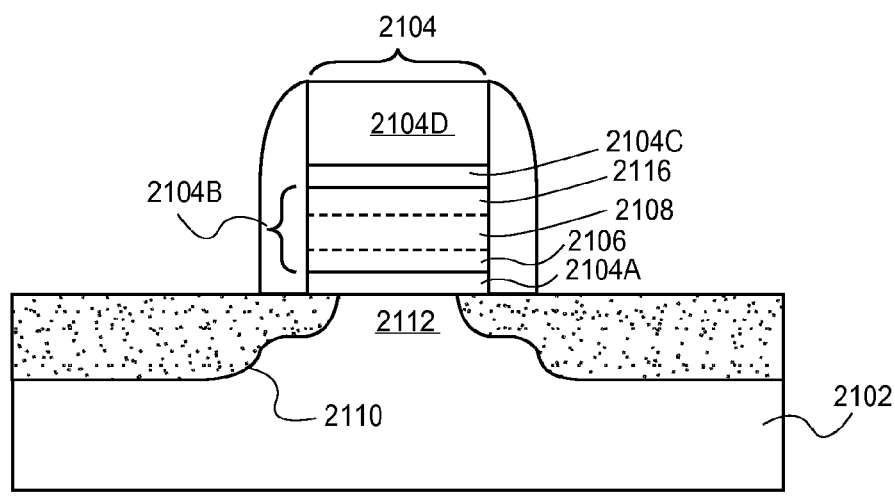
FIG. 21C illustrates a cross-sectional view representing an operation in the formation of a nonvolatile charge trap memory device, in accordance with an embodiment of the present invention.

A nonvolatile charge trap memory device may be fabricated to include a multi-layer charge-trapping region having more than one deuterated layer. FIGS. 21A-21C illustrate cross-sectional views representing operations in the formation of a nonvolatile charge trap memory device, in accordance with an embodiment of the present invention.

Referring to FIG. 21A, a tunnel dielectric layer 2120 formed on the top surface of a substrate 2102 is provided. Substrate 2102 may be composed of any material and have any characteristics described in association with substrates 1802 and 1902 from FIGS. 18 and 19, respectively. Tunnel dielectric layer 2120 may be formed from any material, from any process, and have any thickness described in association with tunnel dielectric layers 1804A and 1904A from FIGS. 18 and 19, respectively.

Referring to FIG. 21B, a multi-layer charge-trapping region 2122 is formed on the top surface of tunnel dielectric layer 2120. In accordance with an embodiment of the present invention, multi-layer charge-trapping region 2122 includes a first deuterated layer 2124 between tunnel dielectric layer 2120 and a charge-trapping layer 2126. Additionally multi-layer charge-trapping region 2122 includes a second deuterated layer 2127 on the top surface of charge-trapping layer 2126, as depicted in FIG. 21B. First deuterated layer 2124, charge-trapping layer 2126, and second deuterated layer 2127 may be composed of any materials and have any thicknesses described in association with first deuterated layer 1906, charge-trapping layer 1908, and second deuterated layer 1916, respectively, from FIG. 19. Multi-layer charge-trapping region 2122 and, hence, first and second deuterated layers 2124 and 2127 and charge-trapping layer 2126 may be formed by any process suitable to provide substantially uniform coverage above tunnel dielectric layer 2120. In accordance with an embodiment of the present invention, multi-layer charge-trapping region 2122 is formed by a chemical vapor deposition process. In one embodiment, first deuterated layer 2124 is formed first using deuterated formation gases, charge-trapping layer 2126 is formed next using non-deuterated formation gases and, finally, second deuterated layer 2127 is formed using deuterated formation gases. In a specific embodiment, multi-layer charge-trapping region 2122 is composed substantially of silicon oxy-nitride, wherein first deuterated layer 2124 is formed first using formation gases such as, but not limited to, $SiD_4$, $SiD_2Cl_2$, $N_2O$, $ND_3$ or $O_2$. Charge-trapping layer 2126 is then formed using formation gases such as, but not limited to, non-deuterated-BTBAS, $SiH_4$, $SiH_2Cl_2$, $N_2O$, $NH_3$ or $O_2$. Finally, second deuterated layer 2127 is formed using formation gases such as, but not limited to, $SiD_4$, $SiD_2Cl_2$, $N_2O$, $ND_3$ or $O_2$. In a particular embodiment, first deuterated layer 2124, charge-trapping layer 2126 and second deuterated layer 2127 are formed in the same process operation, i.e. in the same process chamber with a seamless transition from deuterated formation gases to non-deuterated formation gases and back to deuterated formation gases.

An abrupt deuterated and non-deuterated junction may be present at the interfaces of first deuterated layer 2124, second deuterated layer 2127 and charge-trapping layer 2126. Thus, in accordance with an embodiment of the present invention, charge-trapping layer 2126 remains deuterium-free. Alternatively, some of the deuterium present in first and second deuterated layers 2124 and 2127 may migrate to charge-trapping layer 2126 during the deposition of charge-trapping layer 2126 and second deuterated layer 2127 or during subsequent high temperature process operations. That is, a gradient of deuterium atom concentration moving from high concentration of deuterium in first and second deuterated layers 2124 and 2127 ranging to low concentration of deuterium in charge-trapping layer 2126 may be formed. Thus, in accordance with an alternative embodiment of the present invention, charge-trapping layer 2126 becomes a partially deuterated layer, but having a deuterium concentration less than that of first and second deuterated layers 2124. In a specific embodiment, deuterated formation gases are employed to form a partially deuterated charge-trapping layer 2126 having a deuterium concentration less than that of deuterated layer 2124.

Referring to FIG. 21C, process operations similar to those described in association with FIGS. 20D-20I are carried out to form a nonvolatile charge trap memory device having more than one deuterated layer. Thus, a patterned gate stack 2104 is formed over a substrate 2102. Source and drain regions 2110 are formed on either side of patterned gate stack 2104, defining a channel region 2112. Patterned gate stack 2104 includes a patterned tunnel dielectric layer 2104A, a patterned multi-layer charge-trapping region 2104B, a patterned top dielectric layer 2104C and a patterned gate layer 2104D. Patterned multi-layer charge-trapping region 2104B includes a patterned first deuterated layer 2106 and a patterned second deuterated layer 2116 sandwiching patterned charge-trapping layer 2108.

Figure 22:
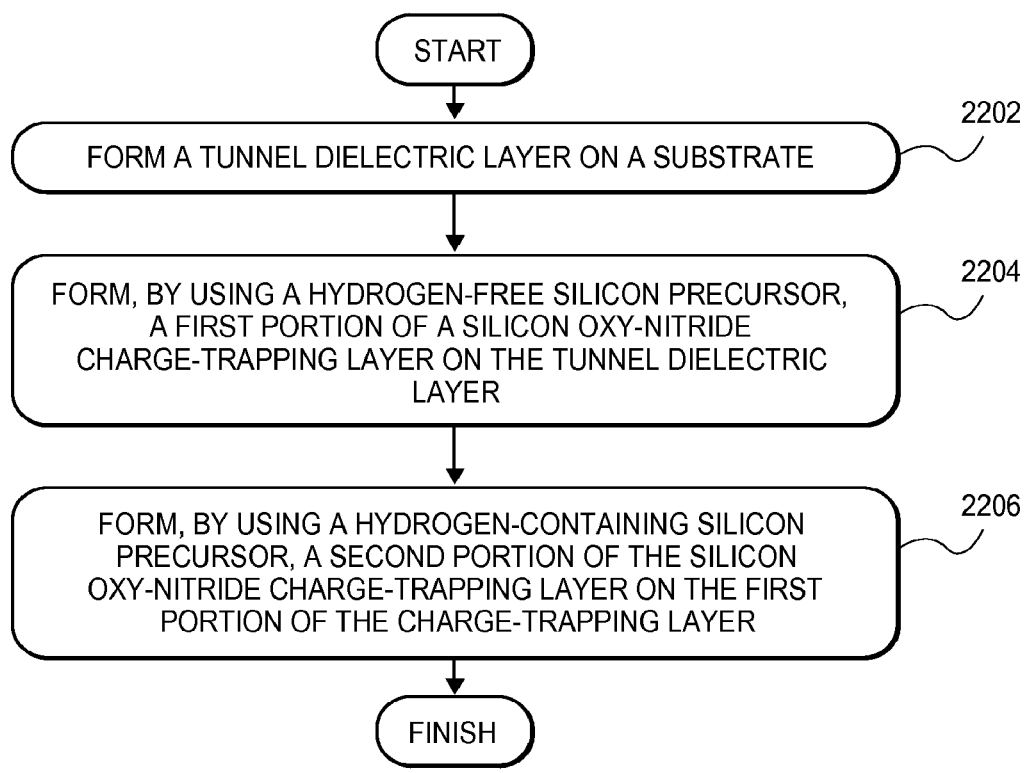
FIG. 22 illustrates a flowchart representing operations in a method for fabricating a nonvolatile charge trap memory device, in accordance with an embodiment of the present invention.

Deuterium may be introduced into only one or a few layers of a stack by switching deposition precursors during the deposition of various layers of the stack. FIG. 22 illustrates a Flowchart 2200 representing operations in a method for fabricating a nonvolatile charge trap memory device, in accordance with an embodiment of the present invention.

Referring to operation 2202 of Flowchart 2200, a method for fabricating a nonvolatile charge trap memory device includes forming a tunnel dielectric layer on a substrate. In an embodiment, the nonvolatile charge trap memory device is a SONOS-type device.

Referring to operation 2204 of Flowchart 2200, by using a hydrogen-free silicon precursor, a first portion of a silicon oxy-nitride charge-trapping layer is formed on the tunnel dielectric layer. In an embodiments, using the hydrogen-free silicon precursor includes using $SiCl_4$ or $Si_2Cl_6$. In one embodiment, forming the first portion of the silicon oxy-nitride charge-trapping layer includes using a set of precursors including $SiCl_4$, $N_2O$ and $ND_3$. In a specific embodiment, using the set of precursors includes using a $SiCl_4$:$N_2O$ ratio of approximately 2.15:1 and using a $SiCl_4$:$ND_3$ ratio of approximately 4:1.

Referring to operation 2206 of Flowchart 2200, by using a hydrogen-containing silicon precursor, a second portion of the silicon oxy-nitride charge-trapping layer is formed on the first portion of the charge-trapping layer. In an embodiment, using the hydrogen-containing silicon precursor includes using $SiH_2Cl_2$. In one embodiment, forming the second portion of the silicon oxy-nitride charge-trapping layer includes using a set of precursors including $SiH_2Cl_2$, $N_2O$ and $NH_3$. In a specific embodiment, using the set of precursors includes using a $SiH_2Cl_2$:$N_2O$ ratio of approximately 2.15:1, and using a $SiH_2Cl_2$:$NH_3$ ratio of approximately 4:1. In an embodiment, forming the first and second portions includes forming the first portion of the silicon oxy-nitride charge-trapping layer to have a lower charge-trap density than the second portion of the silicon oxy-nitride charge-trapping layer. In accordance with an embodiment of the present invention, forming the first and second portions includes forming the first portion of the silicon oxy-nitride charge-trapping layer to provide a tunneling portion and forming the second portion of the silicon oxy-nitride charge-trapping layer to provide a memory portion. In an embodiment, a blocking dielectric layer is formed on the second portion of the charge-trapping layer.

Figure 23:
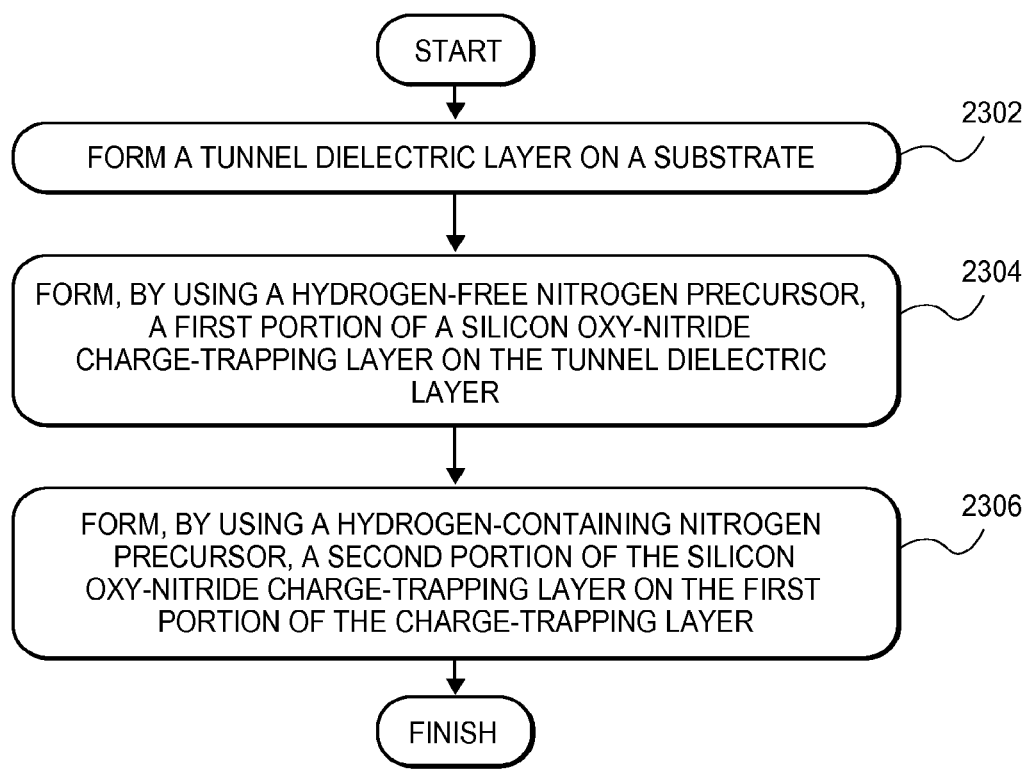
FIG. 23 illustrates a flowchart representing operations in a method for fabricating a nonvolatile charge trap memory device, in accordance with an embodiment of the present invention.

A similar switch as described above for hydrogen-free silicon precursors to hydrogen-containing silicon precursors can instead, or in addition, also be performed for a hydrogen-free nitrogen precursor switch to a hydrogen-containing nitrogen precursor. FIG. 23 illustrates a Flowchart 2300 representing operations in a method for fabricating a nonvolatile charge trap memory device, in accordance with an embodiment of the present invention.

Referring to operation 2302 of Flowchart 2300, a method for fabricating a nonvolatile charge trap memory device includes forming a tunnel dielectric layer on a substrate. In an embodiment, the nonvolatile charge trap memory device is a SONOS-type device.

Referring to operation 2304 of Flowchart 2300, by using a hydrogen-free nitrogen precursor, a first portion of a silicon oxy-nitride charge-trapping layer is formed on the tunnel dielectric layer. In an embodiment, using the hydrogen-free nitrogen precursor includes using $ND_3$. In one embodiment, forming the first portion of the silicon oxy-nitride charge-trapping layer includes using a set of precursors including $SiCl_4$, $N_2O$ and $ND_3$. In a specific embodiment, using the set of precursors includes using a $SiCl_4$:$N_2O$ ratio of approximately 2.15:1 and using a $SiCl_4$:$ND_3$ ratio of approximately 4:1.

Referring to operation 2306 of Flowchart 2300, by using a hydrogen-containing nitrogen precursor, a second portion of the silicon oxy-nitride charge-trapping layer is formed on the first portion of the charge-trapping layer. In an embodiment, using the hydrogen-containing nitrogen precursor includes using $NH_3$. In one embodiment, forming the second portion of the silicon oxy-nitride charge-trapping layer includes using a set of precursors including $SiH_2Cl_2$, $N_2O$ and $NH_3$. In a specific embodiment, using the set of precursors includes using a $SiH_2Cl_2$:$N_2O$ ratio of approximately 2.15:1, and using a $SiH_2Cl_2$:$NH_3$ ratio of approximately 4:1. In an embodiment, forming the first and second portions includes forming the first portion of the silicon oxy-nitride charge-trapping layer to have a lower charge-trap density than the second portion of the silicon oxy-nitride charge-trapping layer. In accordance with an embodiment of the present invention, forming the first and second portions includes forming the first portion of the silicon oxy-nitride charge-trapping layer to provide a tunneling portion and forming the second portion of the silicon oxy-nitride charge-trapping layer to provide a memory portion. In an embodiment, a blocking dielectric layer is formed on the second portion of the charge-trapping layer.

Thus, nonvolatile charge trap memory devices and methods to form the same have been disclosed. In an embodiment, a method for fabricating a nonvolatile charge trap memory device is described. The method includes forming a first oxide layer on a surface of a substrate. The first oxide layer is exposed to a first decoupled plasma nitridation process having a first bias. Subsequently, a charge-trapping layer is formed on the first oxide layer. The charge-trapping layer is exposed to an oxidation process and then to a second decoupled plasma nitridation process having a second, different, bias. In another embodiment, a method for fabricating a nonvolatile charge trap memory device includes forming a charge-trapping layer on a tunnel dielectric layer on a substrate. A first portion of a blocking dielectric layer is formed on the charge-trapping layer. The first portion of the blocking dielectric layer is exposed to a steam environment. A second portion of the blocking dielectric layer is formed on the first portion of the blocking dielectric layer, the second portion having a higher dielectric constant than the first portion. The second portion of the blocking dielectric layer is the annealed. In another embodiment, a method for fabricating a nonvolatile charge trap memory device includes forming a tunnel dielectric layer on a substrate. By using a hydrogen-free silicon precursor, a first portion of a silicon oxy-nitride charge-trapping layer is formed on the tunnel dielectric layer. By using a hydrogen-containing silicon precursor, a second portion of the silicon oxy-nitride charge-trapping layer is formed on the first portion of the charge-trapping layer.

What is claimed is:

1. A method comprising:
    forming a first oxide layer;
    etching a portion of the first oxide layer using a first decoupled plasma nitridation process; and
    forming, subsequent to the etching, a charge-trapping layer on the first oxide layer, wherein the charge-trapping layer includes an oxide-rich oxy-nitride portion and a silicon-rich oxy-nitride portion.

2. The method of claim 1, further comprising:
    oxidizing the charge-trapping layer; and
    nitriding, subsequent to oxidizing, the charge-trapping layer using a second decoupled plasma nitridation process.

3. The method of claim 1, wherein forming the first oxide layer comprises thermally growing silicon dioxide.

4. The method of claim 1, wherein etching the portion of the first oxide layer using the first decoupled plasma nitridation process comprises etching the portion of the first oxide layer while implanting nitrogen into another portion of the first oxide layer.

5. The method of claim 1, wherein etching the portion of the first oxide layer using the first decoupled plasma nitridation process is performed at a first bias voltage in a range of −100 to +200 Volts.

6. The method of claim 1, wherein forming the charge-trapping layer on the first oxide layer comprises depositing a silicon-rich silicon oxy-nitride layer.

7. The method of claim 6, wherein depositing a silicon-rich silicon oxy-nitride layer comprises depositing to a thickness of approximately 10 nanometers.

8. The method of claim 2, wherein oxidizing the charge-trapping layer comprises converting a top portion of the charge-trapping layer to a second oxide layer using a steam oxidation process, and wherein nitriding the charge-trapping layer using a second decoupled plasma nitridation process comprises converting a top portion of the second oxide layer to a silicon nitride layer.

9. The method of claim 2, wherein nitriding the charge-trapping layer using a second decoupled plasma nitridation process is insufficient to etch the charge-trapping layer.

10. The method of claim 2, wherein nitriding the charge-trapping layer using a second decoupled plasma nitridation process is performed at a second bias voltage in a range of −100 to +100 Volts.

11. A method comprising:
    forming a first oxide layer;
    performing a first decoupled plasma nitridation process on the first oxide layer to etch a portion of the first oxide layer;
    forming, subsequent to performing the first decoupled nitridation process, an oxide-rich oxy-nitride portion of a charge-trapping layer on the first oxide layer; and
    forming a silicon-rich oxy-nitride portion of the charge trapping layer on the oxide-rich oxy-nitride portion.

12. The method of claim 11, further comprising:
    performing an oxidation process on the silicon-rich oxy-nitride portion of the charge-trapping layer; and
    performing, subsequent performing the oxidation process, a second decoupled plasma nitridation process on the silicon-rich oxy-nitride portion of the charge-trapping layer.

13. The method of claim 11, wherein forming the first oxide layer comprises thermally growing silicon dioxide.

14. The method of claim 11, wherein performing the first decoupled plasma nitridation process on the first oxide layer comprises etching the portion of the first oxide layer while implanting nitrogen into another portion of the first oxide layer.

15. The method of claim 11, wherein performing the first decoupled plasma nitridation process on the first oxide layer is performed at a first bias voltage in a range of −100 to +200 Volts.

16. The method of claim 11, wherein forming the silicon-rich oxy-nitride portion of the charge trapping layer on the oxide-rich oxy-nitride portion comprises depositing to a thickness of approximately 10 nanometers.

17. The method of claim 12, wherein performing the oxidation process on the silicon-rich oxy-nitride portion of the charge-trapping layer comprises converting a top portion of the silicon-rich oxy-nitride portion to a second oxide layer by a steam oxidation process, and wherein performing the second decoupled plasma nitridation process on the silicon-rich oxy-nitride portion of the charge-trapping layer comprises converting a top portion of the second oxide layer to a silicon nitride layer.

18. The method of claim 17, wherein converting the top portion of the silicon-rich oxy-nitride portion to the second oxide layer by the steam oxidation process comprises converting approximately 6 nanometers of the silicon-rich oxy-nitride portion, and wherein converting the top portion of the second oxide layer to the silicon nitride layer comprises converting approximately 4 nanometers of the second oxide layer.

19. The method of claim 12, wherein performing the second decoupled plasma nitridation process is insufficient to etch the silicon-rich oxy-nitride portion of the charge-trapping layer.

20. The method of claim 12, wherein performing the second decoupled plasma nitridation process is performed at a second bias voltage in a range of −100 to +100 Volts.

* * * * *